(12) United States Patent
Rokhsaz et al.

(10) Patent No.: US 10,389,027 B2
(45) Date of Patent: *Aug. 20, 2019

(54) METHOD AND APPARATUS FOR SENSING ENVIRONMENTAL PARAMETERS USING WIRELESS SENSOR(S)

(71) Applicant: RFMicron, Inc., Austin, TX (US)

(72) Inventors: Shahriar Rokhsaz, Austin, TX (US);
Brian David Young, Austin, TX (US);
Ahmed Younis, San Antonio, TX (US)

(73) Assignee: RF Micron, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/982,519

(22) Filed: May 17, 2018

(65) Prior Publication Data

US 2018/0351257 A1    Dec. 6, 2018

Related U.S. Application Data

(60) Continuation of application No. 14/727,523, filed on Jun. 1, 2015, now Pat. No. 9,991,596, which is a
(Continued)

(51) Int. Cl.
*H01Q 7/00* (2006.01)
*H01Q 1/22* (2006.01)
(Continued)

(52) U.S. Cl.
CPC ......... *H01Q 7/005* (2013.01); *G06K 7/10148* (2013.01); *G06K 7/10336* (2013.01);
(Continued)

(58) Field of Classification Search
CPC .... H01Q 7/005; H01Q 1/2216; H01Q 1/2225; H01Q 1/2291; H01Q 1/36; H01Q 1/38;
(Continued)

(56) References Cited

U.S. PATENT DOCUMENTS 6,317,027 B1   11/2001 Watkins
8,318,099 B2   11/2012 Potyrailo
(Continued)

*Primary Examiner* — Nay Tun
(74) *Attorney, Agent, or Firm* — Garlick & Markison; Timothy W. Markison; Patricia A. Markison

(57) ABSTRACT

A method includes varying, by a tuning module of a passive radio RFID sensor, a reactive component impedance coupled to the tuning module and an antenna of the passive RFID sensor in order to change a system impedance. The method further includes producing an impedance value representative of the reactive component's impedance. The method further includes storing, by a memory module of the passive RFID sensor, the impedance value, identification information corresponding to the antenna, and a timestamp corresponding to the impedance value. The method further includes communicating, by a wireless communication module of the passive RFID sensor, the impedance value, the identification information, and the timestamp to an RFID reader. When the impedance value, the identification information, and the timestamp indicate an unfavorable environmental condition, the method further includes generating, by the RFID reader, an alarm signal.

12 Claims, 43 Drawing Sheets

Related U.S. Application Data continuation-in-part of application No. 14/256,877, filed on Apr. 18, 2014, now Pat. No. 9,785,807, which is a continuation-in-part of application No. 13/209,420, filed on Aug. 14, 2011, now Pat. No. 8,749,319, which is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, said application No. 14/256,877 is a continuation-in-part of application No. 13/209,425, filed on Aug. 14, 2011, now Pat. No. 9,048,819, which is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, said application No. 14/256,877 is a continuation-in-part of application No. 13/467,925, filed on May 9, 2012, which is a continuation-in-part of application No. 13/209,425, filed on Aug. 14, 2011, now Pat. No. 9,048,819, which is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385.

(60) Provisional application No. 62/004,941, filed on May 30, 2014, provisional application No. 62/004,943, filed on May 30, 2014, provisional application No. 62/011,116, filed on Jun. 12, 2014, provisional application No. 62/131,414, filed on Mar. 11, 2015, provisional application No. 61/428,170, filed on Dec. 29, 2010, provisional application No. 61/485,732, filed on May 13, 2011, provisional application No. 61/814,241, filed on Apr. 20, 2013, provisional application No. 61/833,150, filed on Jun. 10, 2013, provisional application No. 61/833,167, filed on Jun. 10, 2013, provisional application No. 61/833,265, filed on Jun. 10, 2013, provisional application No. 61/871,167, filed on Aug. 28, 2013, provisional application No. 61/875,599, filed on Sep. 9, 2013, provisional application No. 61/896,102, filed on Oct. 27, 2013, provisional application No. 61/929,017, filed on Jan. 18, 2014, provisional application No. 61/934,935, filed on Feb. 3, 2014.

(51) Int. Cl.
| | | |
|---|---|---|
| *G06K 7/10* | (2006.01) | |
| *H04B 5/00* | (2006.01) | |
| *G06K 19/07* | (2006.01) | |
| *H01Q 1/36* | (2006.01) | |
| *H01Q 1/38* | (2006.01) | |
| *H01Q 9/04* | (2006.01) | |
| *H01Q 9/28* | (2006.01) | |
| *H01Q 13/10* | (2006.01) | |
| *H03H 7/40* | (2006.01) | |
| *H04W 4/70* | (2018.01) | |

(52) U.S. Cl.
CPC ..... *G06K 19/0717* (2013.01); *G06K 19/0723* (2013.01); *H01Q 1/2216* (2013.01); *H01Q 1/2225* (2013.01); *H01Q 1/2291* (2013.01); *H01Q 1/36* (2013.01); *H01Q 1/38* (2013.01); *H01Q 9/0407* (2013.01); *H01Q 9/285* (2013.01); *H01Q 13/106* (2013.01); *H04B 5/0062* (2013.01); *H04B 5/0081* (2013.01); *H03H 7/40* (2013.01); *H04W 4/70* (2018.02)

(58) Field of Classification Search
CPC .... H01Q 9/0407; H01Q 9/285; H01Q 13/106; G06K 7/10148; G06K 7/10336; G06K 19/0717; G06K 19/0723; H04B 5/0062
See application file for complete search history.

(56) References Cited

U.S. PATENT DOCUMENTS

| | | |
|---|---|---|
| 8,952,792 B1 | 2/2015 | Srinivas |
| 2002/0145526 A1 | 10/2002 | Friedman |
| 2003/0102961 A1 | 6/2003 | Fischer |
| 2003/0227392 A1* | 12/2003 | Ebert ................ G06K 17/00 340/8.1 |
| 2004/0070510 A1 | 4/2004 | Zhang et al. |
| 2004/0203377 A1* | 10/2004 | Eaton ................ H04W 4/02 455/41.2 |
| 2005/0171738 A1* | 8/2005 | Kadaba ............ G06K 19/0717 702/187 |
| 2006/0022800 A1* | 2/2006 | Krishna ............ G06K 7/0008 340/10.2 |
| 2006/0109124 A1 | 5/2006 | Dixon |
| 2009/0045961 A1 | 2/2009 | Chamarti et al. |
| 2010/0225482 A1 | 9/2010 | Kasai |
| 2012/0126911 A1 | 5/2012 | Romanko |
| 2012/0176240 A1 | 7/2012 | Athalye et al. |
| 2013/0123726 A1 | 5/2013 | Yu et al. |
| 2013/0293354 A1 | 11/2013 | Vemagiri et al. |
| 2015/0080819 A1 | 3/2015 | Charna |
| 2015/0135078 A1 | 5/2015 | Erkkila |

\* cited by examiner

Die Attach Area (see, FIG. 17E)

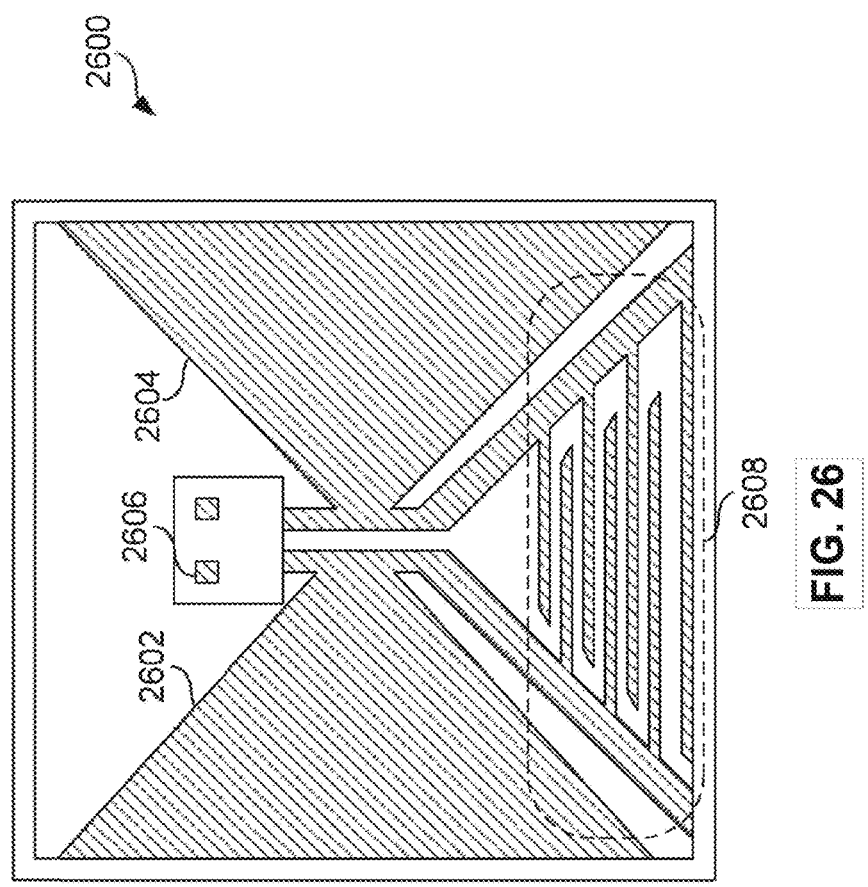

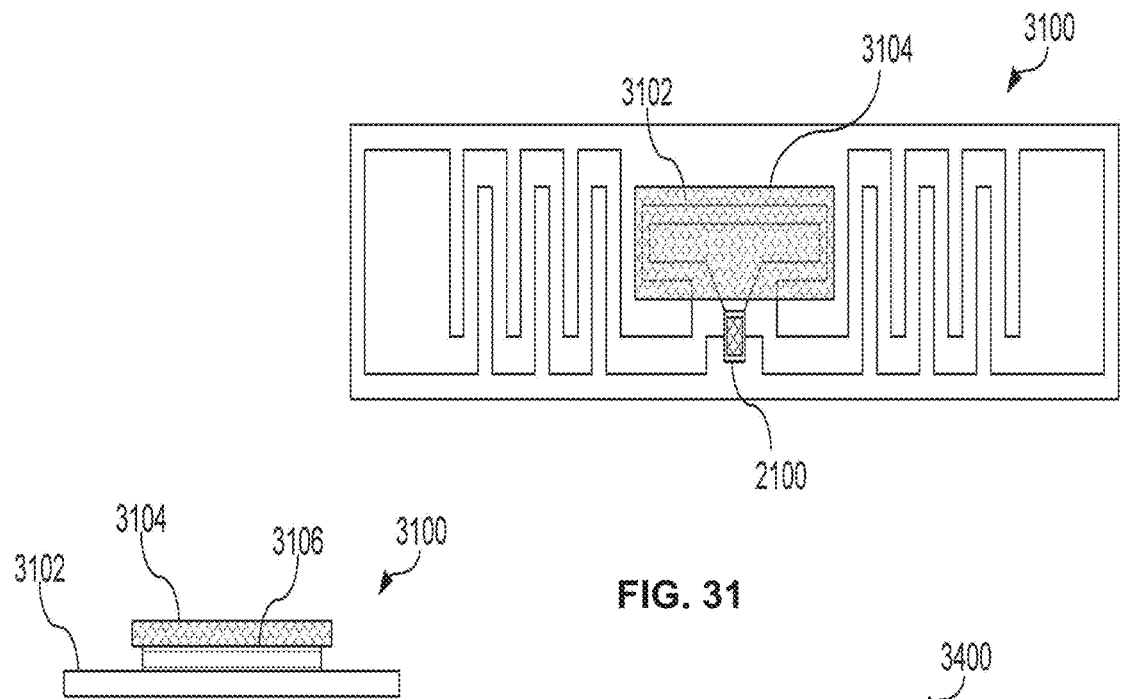
FIG. 31
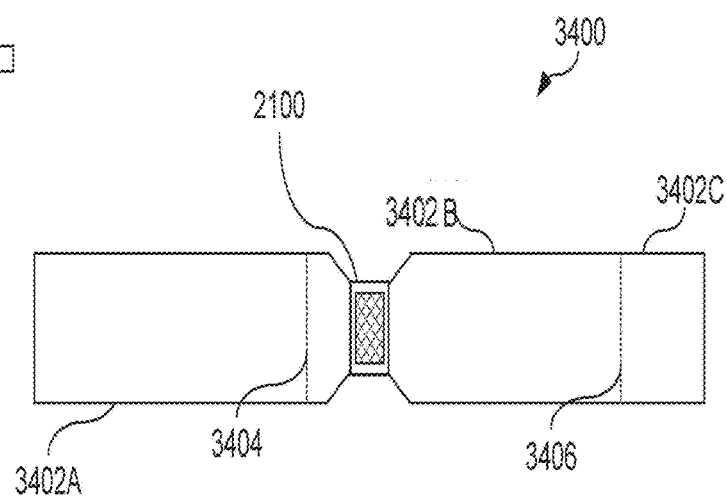
FIG. 32
FIG. 34A

US 10,389,027 B2

METHOD AND APPARATUS FOR SENSING ENVIRONMENTAL PARAMETERS USING WIRELESS SENSOR(S)

CROSS-REFERENCE TO RELATED PATENTS

This Patent Application claims priority under 35 USC § 120 as a continuation of co-pending patent application entitled "Method and Apparatus For Sensing Environmental Parameters Using Wireless Sensor(S)," having a filing date of 1 Jun. 2015 and a Ser. No. of 14/727,523, which is a continuation-in-part patent application of patent application entitled "Method and Apparatus for Sensing Environment Using a Wireless Passive Sensor", having a filing date of 18 Apr. 2014 and a Ser. No. of 14/256,877, now issued as U.S. Pat. No. 9,785,807.

U.S. patent application Ser. No. 14/727,523 further claims priority under 35 USC § 119(e) to the following U.S. Provisional Patent Applications:
1. U.S. Provisional Application Ser. No. 62/004,941, filed 30 May 2014, (Entitled: "Pressure/Proximity Sensors reference design");
2. U.S. Provisional Application Ser. No. 62/004,943, filed 30 May 2014, (Entitled: "Method and Apparatus for Varying an Impedance");
3. U.S. Provisional Application Ser. No. 62/011,116, filed 12 Jun. 2014, (Entitled: "Method and Apparatus for Sensing Water Level Using Wireless Sensor(s)");
4. U.S. Provisional Application Ser. No. 62/131,414, filed 11 Mar. 2015, (Entitled: "Method and Apparatus for Variable Capacitor Control");

The above-referenced pending U.S. patent application having Ser. No. of 14/256,877 claims priority:
1. under 35 USC § 120 as a continuation-in-part patent application to then co-pending patent application entitled "Method and Apparatus for Detecting RF Field Strength", having a filing date of 14 Aug. 2011, and a Ser. No. of 13/209,420, now issued U.S. Pat. No. 8,749,319;
2. under 35 USC § 120 as a continuation-in-part patent application to then co-pending patent application entitled "Method and Apparatus for Detecting RF Field Strength", having a filing date of 14 Aug. 2011, and a Ser. No. of 13/209,425, now issued U.S. Pat. No. 9,048,819;
3. under 35 USC § 120 as a continuation-in-part patent application to co-pending patent application entitled "Roll-To-Roll Production of RFID Tags", having a filing date of 9 May 2012, and a Ser. No. of 13/467,925;
4. under 35 USC § 119(e) to U.S. Provisional Application Ser. No. 61/814,241, filed 20 Apr. 2013;
5. under 35 USC § 119(e) to U.S. Provisional Application Ser. No. 61/833,150, filed 10 Jun. 2013;
6. under 35 USC § 119(e) to U.S. Provisional Application Ser. No. 61/833,167, filed 10 Jun. 2013;
7. under 35 USC § 119(e) to U.S. Provisional Application Ser. No. 61/833,265, filed 10 Jun. 2013;
8. under 35 USC § 119(e) to U.S. Provisional Application Ser. No. 61/871,167, filed 28 Aug. 2013;
9. under 35 USC § 119(e) to U.S. Provisional Application Ser. No. 61/875,599, filed 9 Sep. 2013;
10. under 35 USC § 119(e) to U.S. Provisional Application Ser. No. 61/896,102, filed 27 Oct. 2013;
11. under 35 USC § 119(e) to U.S. Provisional Application Ser. No. 61/929,017, filed 18 Jan. 2014; and
12. under 35 USC § 119(e) to U.S. Provisional Application Ser. No. 61/934,935, filed 3 Feb. 2014.

The above-referenced then pending U.S. patent application having the Ser. No. of 13/209,420 claims priority:
1. under 35 USC § 120 as a continuation-in-part patent application to then co-pending patent application entitled Method And Apparatus For Varying An Impedance, having a filing date of 1 Aug. 2009, and a Ser. No. of 12/462,331, now issued U.S. Pat. No. 8,081,043;
2. under 35 USC § 119(e) to U.S. Provisional Application Ser. No. 61/428,170, filed 29 Dec. 2010; and
3. under 35 USC § 119(e) to U.S. Provisional Application Ser. No. 61/485,732, filed 13 May 2011.

The above-referenced then pending U.S. patent application having the Ser. No. of 13/209,425 claims priority:
1. under 35 USC § 120 as a continuation-in-part patent application to then co-pending patent application entitled Method And Apparatus For Varying An Impedance, having a filing date of 1 Aug. 2009, and a Ser. No. of 12/462,331, now issued U.S. Pat. No. 8,081,043;
2. under 35 USC § 119(e) to U.S. Provisional Application Ser. No. 61/428,170, filed 29 Dec. 2010; and
3. under 35 USC § 119(e) to U.S. Provisional Application Ser. No. 61/485,732, filed 13 May 2011.

The above-referenced pending U.S. patent application having the Ser. No. of 13/467,925 claims priority:
1. under 35 USC § 120 as a continuation-in-part patent application to then co-pending patent application entitled Method and Apparatus for Detecting RF Field Strength, having a filing date of 14 Aug. 2011, and a Ser. No. of 13/209,425, now issued U.S. Pat. No. 9,048,819;
2. under 35 USC § 119(e) to U.S. Provisional Application Ser. No. 61/485,732, filed 13 May 2011;

The above-referenced then pending U.S. patent application having the Ser. No. of 12/462,331 claims priority:
1. under 35 USC § 121 as a divisional patent application to then co-pending patent application entitled Method And Apparatus For Varying An Impedance, having a filing date of 18 Nov. 2006, and a Ser. No. of 11/601,085, now issued U.S. Pat. No. 7,586,385;

The above identified U.S. Provisional patent applications, U.S. patent applications, and priority application lineage and their subject matter are expressly incorporated by reference in their entirety and made part of the present U.S. Utility patent application for all purposes.

BACKGROUND OF THE INVENTION

1. Field of the Invention

The present invention relates generally to sensing a detectable environmental condition, and, in particular, to sensing a detectable environmental condition in a passive RFID system.

2. Description of the Related Art

In general, in an RF communication system, a single antenna structure is adapted to receive signals, the carrier frequencies ("$f_C$") of these signals can vary significantly from the resonant frequency ("$f_R$") of the antenna. The mismatch between $f_C$ and $f_R$ results in loss of transmitted power. In some applications, this may not be of particular concern, but, in others, such as in RF identification ("RFID") applications, such losses are of critical concern. For example, in a passive RFID tag a significant portion of received power is used to develop all of the operating power required by the RFID tag's electrical circuits. In such an application, a variable impedance circuit can be employed to shift the $f_R$ of the tag's receiver so as to better match the $f_C$ of the transmitter of the system's RFID reader. A single design that is useful in all systems is precluded by the lack of standards as to appropriate RFID system frequencies, and, the breadth of the available frequency spectrum is quite broad: Low-Frequency ("LF"), including 125-134.2 kHz and 140-148. f kHz; High-Frequency ("HF") at 13.56 MHz; and Ultra-High Frequency ("UHF") at 868-928 MHz. Compounding this problem is the fact that system manufacturers cannot agree on which specific $f_C$ is the best for specific uses, and, indeed, to prevent cross-talk, it is desirable to allow each system to distinguish itself from nearby systems by selecting different $f_C$ within a defined range.

Attempts have been made to improve the ability of the tag's antenna to compensate for system variables, such as the materials used to manufacture the tag. However, such structural improvements, while valuable, do not solve the basic need for a variable impedance circuit having a relatively broad tuning range.

Shown in FIG. 1 is an ideal variable impedance circuit 100. Circuit 100 comprised of a variable inductor 1 02, a variable capacitor 1 04 and a variable resistor. When used as a tank in a resonant system, the circuit 100 exhibits a quality factor ("Q") of:

$$Q = \frac{f_R}{\Delta_f} = \frac{1}{R}\sqrt{\frac{L}{C}} \qquad [1]$$

where: Q=the quality factor of circuit 100;
$f_R$—the resonant frequency of circuit 100, measured in hertz;
$\Delta f$=the bandwidth of circuit 100, measured in hertz at −3 db
R=the resistance of resistor, measured in ohms;
L=the inductance of variable inductor 102, measured in henries; and
C=the capacitance of capacitor, measured in farads.
In such a system, the resonant frequency, $f_R$, of circuit 100 is:

$$f_R = \frac{1}{2\pi\sqrt{LC}} \qquad [2]$$

As is well known, the total impedance of circuit 100 is:

$$Z = \frac{Z_L Z_C}{Z_L + Z_C} \qquad [3]$$

where: Z=the total impedance of circuit 100, measured in ohms;
$Z_L$=the impedance of variable inductor 102, measured in ohms; and
$Z_C$=the impedance of capacitor, measured in ohms.
As is known, the relationship between impedance, resistance and reactance is:

$$Z = R + jX \qquad [4]$$

where: Z=impedance, measured in ohms;
R=resistance, measured in ohms;
j=the imaginary unit $\sqrt{-1}$; and
X=reactance, measured in ohms.
In general, it is sufficient to consider just the magnitude of the impedance:

$$|Z| = \sqrt{R^2 + X^2} \qquad [5]$$

For a purely inductive or capacitive element, the magnitude of the impedance simplifies to just the respective reactances. Thus, for variable inductor 102, the reactance can be expressed as:

$$X_L = 2\pi f L \qquad [6]$$

Similarly, for capacitor, the reactance can be expressed as:

$$X_C = \frac{1}{2\pi f C} \qquad [7]$$

Because the reactance of variable inductor 102 is in phase while the reactance of capacitor is in quadrature, the reactance of variable inductor 102 is positive while the reactance of capacitor is negative. Accordingly, a desired total impedance can be maintained if a change in inductive reactance is offset by an appropriate change in capacitive reactance.

Within known limits, changes can be made in the relative values of variable inductor 102, capacitor, and resistor to adjust the resonant frequency, $f_R$, of circuit 100 to better match the carrier frequency, $f_C$, of a received signal, while, at the same, maximizing Q.

In many applications, such as RFID tags, it may be economically desirable to substitute for variable inductor 1 02 a fixed inductor 202, as in the variable tank circuit 200 shown in FIG. 2. In general, in order to maximize Q in circuit 200.

The amplitude modulated ("AM") signal broadcast by the reader in an RFID system will be electromagnetically coupled to a conventional antenna, and a portion of the current induced in a tank circuit is extracted by a regulator to provide operating power for all other circuits. Once sufficient stable power is available, the regulator will produce, e.g., a power-on-reset signal to initiate system operation. Thereafter, the method disclosed in the Related References, and the associated apparatus, dynamically varies the capacitance of a variable capacitor component of the tank circuit so as to dynamically shift the $f_R$ of the tank circuit to better match the $f_C$ of the received RF signal, thus obtaining maximum power transfer in the system.

BRIEF SUMMARY OF THE INVENTION

Embodiments of the present invention are directed to systems and methods that are further described in the following description and claims. Advantages and features of embodiments of the present invention may become apparent from the description, accompanying the drawings and claims.

Accordingly, the above problems and difficulties are obviated by embodiments of the present invention which provide an RF-based environmental sensing system comprising one or more special antenna arrangements, and an RF transceiver. In this embodiment, the antenna arrangement comprises: an antenna having an antenna impedance; and a transmission line operatively coupled to the antenna and adapted selectively to modify the antenna impendence. Further, the RF transceiver comprises: a tank circuit operatively coupled to the antenna and having a selectively variable impedance; and a tuning circuit adapted to dynamically vary the impedance of the tank circuit, and to develop a first quantized value representative of the impedance of the tank circuit, wherein the first quantized value is a function of the modified antenna impedance.

Further, we provide a method for operating the first embodiment comprising the steps of: exposing the transmission line to a selected environmental condition; dynamically varying the impedance of the tank circuit substantially to match the modified antenna impedance; and using the first value to sense the environmental condition.

Another embodiment of the present disclosure provides an environmental sensing method for use in an RF system comprising the steps of: calibrating an RF sensor by developing a first calibration value indicative of an absence of a detectable quantity of a substance and a second calibration value indicative of a presence of the detectable quantity of the substance; installing the sensor in a structure; exposing the structure to the substance; interrogating the sensor to retrieve a sensed value; and detecting the presence of the substance in the structure as a function of the sensed value relative to the first and second calibration values.

BRIEF DESCRIPTION OF THE SEVERAL VIEWS OF THE DRAWINGS

My invention may be more fully understood by a description of certain preferred embodiments in conjunction with the attached drawings in which:

FIG. 26 provides an illustration of an antenna arrangement in accordance with embodiments of the present disclosure;

FIGS. 31 and 32 are views of an RFID pressure sensing tag in accordance with an embodiment of the present disclosure;

FIGS. 34A and 34B are views of a folded RFID tag comprising a radiating element in accordance with an embodiment of the present disclosure;

Figure 1:
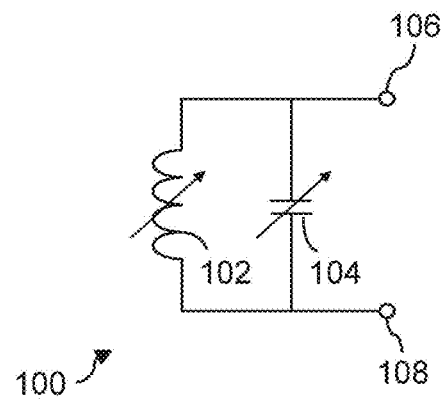
FIG. 1 is an ideal variable impedance circuit.
Figure 2:
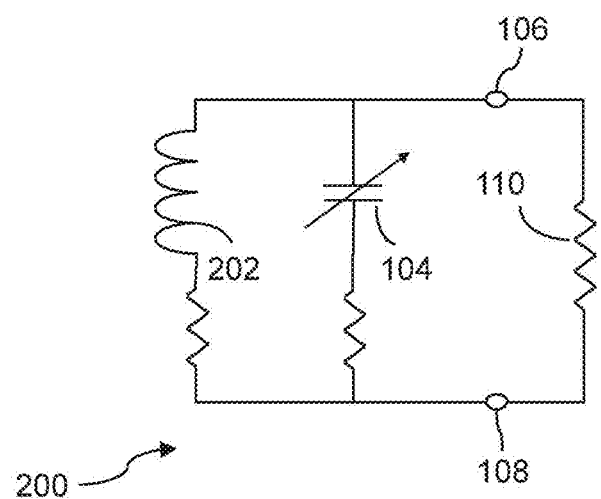
FIG. 2 is a second variable impedance circuit.

In the drawings, similar elements will be similarly numbered whenever possible. However, this practice is simply for convenience of reference and to avoid unnecessary proliferation of numbers, and is not intended to imply or suggest that the present disclosure requires identity in either function or structure in the several embodiments.

DETAILED DESCRIPTION OF THE INVENTION

Preferred embodiments of the present invention are illustrated in the FIGs., like numerals being used to refer to like and corresponding parts of the various drawings.

Throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, reference may be made to the mutually exclusive Boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Embodiments of the present invention provide passive radio frequency identification (RFID) sensor. This passive RFID sensor includes an antenna, a processing module, and a wireless communication module. The antenna has an antenna impedance that may vary with an environment in which the antenna is placed. The processing module couples to the antenna and has a tuning module that may vary a reactive component impedance coupled to the antenna in order to change a system impedance. The system impedance including both the antenna impedance and the reactive component impedance. The tuning module then produces an impedance value representative of the reactive component impedance. A memory module may store the impedance value which may then later be communicated to an RFID reader via the wireless communication module. The RFID reader may then exchange the impedance value representative of the reactive components of impedance with the RFID reader such that the RFID reader or another external processing unit may process the impedance value in order to determine environmental conditions at the antenna. These environmental conditions may include but are not limited to temperature, humidity, wetness, or proximity of the RFID reader to the passive RFID sensor.

Embodiments of the present disclosure provide a self-tuning passive RFID sensors that enable a wide variety of applications. One embodiment provides a sensor for pressure or proximity sensing using a conventional compact dipole antenna augmented with a simple floating sheet of metal. The sensor exploits the basic electromagnetic effect where a sheet of metal brought in proximity to an inductive loop lowers the inductance of the loop due to eddy currents generated on the sheet of metal. The closer the sheet gets to the loop, the lower the inductance.

Conventional dipole design for RFID tags use a small inductive loop to tune out the input capacitance of the RFID IC. By placing a metal sheet near this inductive tuning loop, the inductance depends on the distance between the loop and the sheet. The self-tuning engine detects the change in inductance and adjusts its input capacitance to maintain peak power to the die. The change in capacitance can be read from the die as a sensor code using the standard EPC read command. The sensor code reflects the relative position of the sheet to the antenna inductor.

A proximity sensor mounts the tag onto one surface and a metal patch onto another surface that moves relative to the tag. As the patch moves closer to the tag, the inductance of the tuning loop decreases. The self-tuning engine compensates for the lower inductance with higher capacitance which is then readable as a sensor code with higher value. The sensor reports closer proximity with higher sensor codes.

The proximity sensor can be converted into a pressure sensor by using a pressure sensitive spring between the sheet and the inductor. A simple spring is a small block of closed cell foam, which changes its thickness with pressure. Higher pressures compress the foam and bring the metal sheet closer to the inductor, lowering its inductance. Just as for the proximity sensor, the self-tuning engine compensates for the lower inductance with higher capacitance leading to a larger sensor code. The sensor reports higher pressure as higher sensor codes.

The proximity/pressure sensor uses a conventional compressed dipole with an inductive tuning loop fabricated on PET, polyimide, or other similar plastic material. Possible metallization patterns are discussed with reference to FIGS. 17H, 20, 26, 30A, 30B, 31 and 33. As will be shown, the sensor incorporates a metal patch about the size of the inductive tuning loop placed directly over the tuning loop. The gap between the patch and the antenna can range, in one embodiment the gap varies from about 0.5 mm to 3 mm. The area enclosed by the inductive tuning loop must be tuned for the application so that the sensor code stays within its total tuning range. The sensor code changes as the gap between the tuning loop and the metal patch varies, so the design target would vary the codes within a predetermined range for the smallest gap and the largest gap, leaving margin for manufacturing and environmental variations to avoid pegging the sensor code during normal operation.

For operation as a pressure sensor, the metal patch is mounted over the tuning inductor using closed-cell neoprene foam rubber that can vary in thickness with pressure changes. The sensor codes are averaged to produce a single average sensor code at each pressure. The sensor achieves very linear response to pressure with low hysteresis. A simple linear calibration can be applied to convert the average sensor code reading directly to psi. As pressure sensors can use low-cost closed cell foams to implement very low-cost sensors; however, foams can take a set over time or wear out. Higher precision pressure sensors using steel springs are also possible.

Embodiments of the present disclosure can also serve as a metal detector, where the presence or absence of metal can be measured. The presence of metal in fluid flow in plastic pipe can be measured with potential applications in food processing.

Proximity applications also include on/off applications, such as open/closed sensors for doors or windows. As a security seal, the metal can be stripped off when a container is opened enabling the sensor to detect tampering. Conventional RFID tags can only achieve this function through destruction, leading to the possibility of false positives.

In general, prior disclosures have focused primarily on quantizing the voltage developed by the tank circuit as the primary means of matching the $f_r$ of the tank circuit to the transmission frequency $f_C$, of the received signal. However, this voltage quantization is, at best, indirectly related to received signal field strength. Other effective and efficient methods may quantize the received field strength as a function of induced current. In particular, a method and apparatus adapted to develop this field quantization in a form and manner that is suitable for selectively varying the input impedance of the receiver circuit to maximize received power, especially during normal system operation. Additionally, in light of the power sensitive nature of RFID systems, our disclosed method and apparatus varied the input impedance with a minimum power loss.

While prior disclosures use methods to sense environmental changes to which the RFID tag is exposed. Embodiments of the present disclosure further develop this capability and disclose embodiments specifically adapted to operate in a variety of environments.

Figure 3:
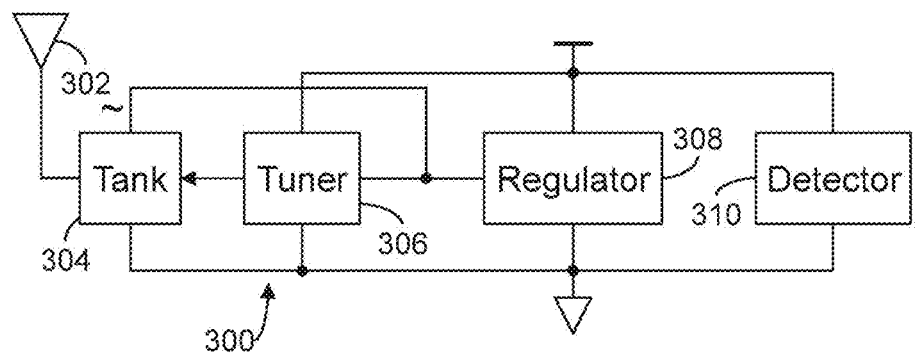
FIG. 3 illustrates, in block diagram form, an RF receiver circuit having a field strength detector constructed in accordance with an embodiment of the present disclosure.

Shown in FIG. 3 is an RF receiver circuit 300 suitable for use m an RFID application. As we have described in our Related References, an RF signal electromagnetically coupled to an antenna 302 is received via a tank circuit 304, the response frequency $f_R$, of which is dynamically varied by a tuner 306 to better match the transmission frequency, $f_C$ of the received RF signal, thus obtaining a maximum power transfer. In particular, the RMS voltage induced across the tank circuit 304 by the received RF signal is quantized by tuner 306 and the developed quantization employed to control the impedance of the tank circuit 304. Also, the unregulated, AC current induced in the tank circuit by the received RF signal is conditioned by a regulator 308 to provide regulated DC operating power to the receiver circuit 300. In accordance with our present disclosure, we now provide a field strength detector 310, also known as a power detector, adapted to develop a field-strength value as a function of the field strength of the received RF signal. As indicated in FIG. 3, field strength detector 310 is adapted to cooperate with the regulator 308 in the development of the field-strength value. As disclosed below, if desired, field strength detector 310 can be adapted to cooperate with the tuner 306 in controlling the operating characteristics of the tank circuit 304.

Figure 4:
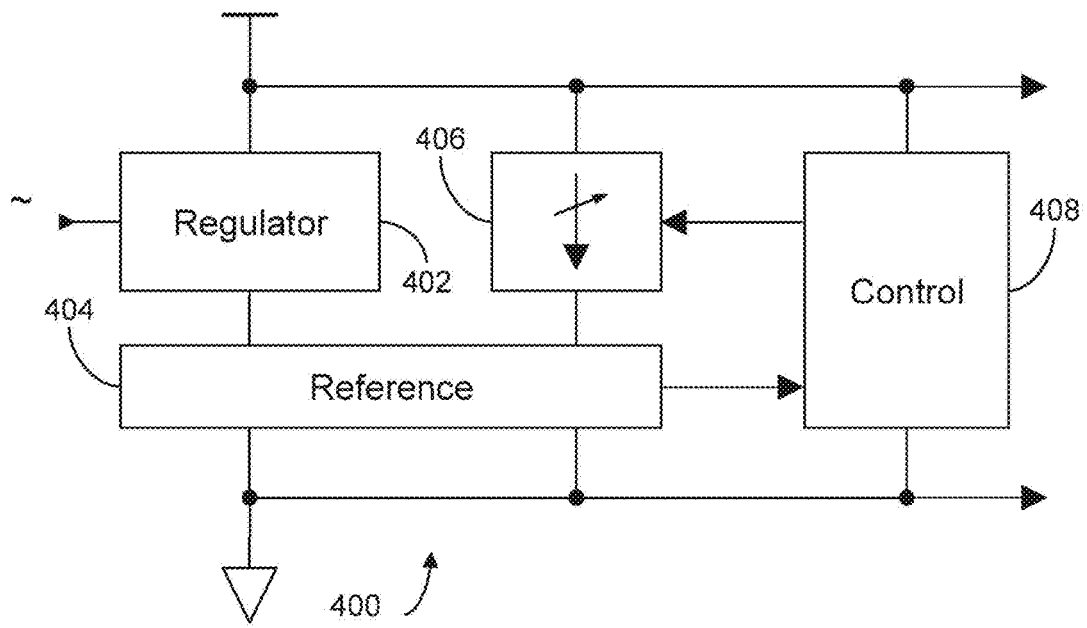
FIG. 4 illustrates, in block diagram form, a field strength detector circuit constructed in accordance with an embodiment of the present disclosure.

Shown by way of example in FIG. 4 is one possible embodiment of a field strength or power detector 400 (field strength detector 310 of FIG. 3). This embodiment employs a shunt-type regulator 402 so that, during normal operation, the shunted 'excess' current can be used as a reference against which we develop the field-strength value. In this regard, reference module 404 produces a shunt current reference value proportional to the shunted current, and then develops a mirrored current reference value as a function of both the shunted current and a field strength reference current provided by a digitally-controlled current source 406. Preferably, once the tuner 306 has completed its initial operating sequence, whereby the $f_R$ of the tank circuit 304 has been substantially matched to the $f_C$ of the received signal, we then enable a digital control 408 to initiate operation of the current source 406 at a predetermined, digitally established minimum field strength reference current. After a predetermined period of time, control 408 captures the mirrored current reference value provided by the current reference module 404, compares the captured signal against a predetermined threshold value, and, if the comparison indicates that the field strength reference current is insufficient, increases, in accordance with a predetermined sequence of digital-controlled increments, the field strength reference current; upon the comparison indicating that the field strength reference current is sufficient, control 408 will, at least temporarily, cease operation.

In accordance with embodiments of the present disclosure, the digital field-strength value developed by control 408 to control the field strength current source 406 is a function of the current induced in the tank circuit 304 by the received RF signal. Once developed, this digital field-strength value can be employed in various ways. For example, it can be selectively transmitted by the RFID device (using conventional means) back to the reader (not shown) for reference purposes. Such a transaction can be either on-demand or periodic depending on system requirements. Imagine for a moment an application wherein a plurality of RFID tag devices are distributed, perhaps randomly, throughout a restricted, 3-dimensional space, e.g., a loaded pallet. Imagine also that the reader is programmed to query, at an initial field strength, all tags "in bulk" and to command all tags that have developed a field-strength value greater than a respective field-strength value to remain 'silent'. By performing a sequence of such operations, each at an increasing field strength, the reader will, ultimately, be able to isolate and distinguish those tags most deeply embedded within the space; once these 'core' tags have been read, a reverse sequence can be performed to isolate and distinguish all tags within respective, concentric 'shells' comprising the space of interest. Although, in all likelihood, these shells will not be regular in either shape or relative volume, the analogy should still be apt.

Figure 5:
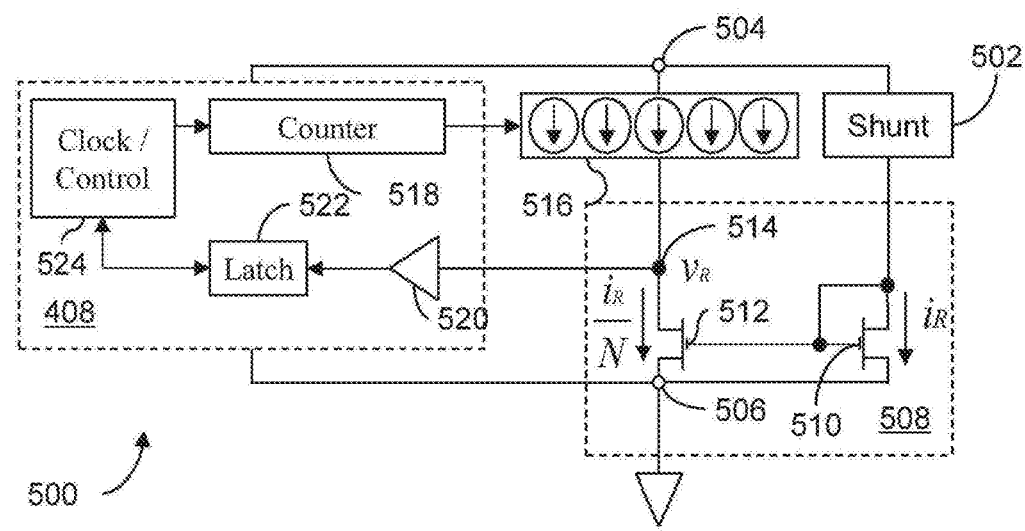
FIG. 5 illustrates, in block schematic form, a more detailed embodiment of the field strength detector circuit shown in FIG. 4.

In FIG. 5, one possible embodiment of a field strength detector 500 is illustrated. In general, shunt circuit 502 to develop a substantially constant operating voltage level across supply node 504 and ground node 506. Shunt regulators of this type are well known in the art, and typically use Zener diodes, avalanche breakdown diodes, diode-connected MOS devices, and the like.

As can be seen, current reference 404 of FIG. 4 is implemented in the form of a current mirror circuit 508, connected in series with shunt circuit 502 between nodes 504 and 506. As is typical, current mirror circuit 508 comprises a diode-connected reference transistor 510 and a mirror transistor 512. If desired, a more sophisticated circuit such as a Widlar current source may be used rather than this basic two-transistor configuration. For convenience of reference, the current shunted by shunt circuit 502 via reference transistor 510 is designated as $i_R$; similarly, the current flowing through mirror transistor 512 is designated $i_R$ as $i_R/N$, wherein, as is known, N is the ratio of the widths of reference transistor 510 and mirror transistor 512.

Here, the field strength current source 516 is implemented as a set of n individual current sources, each connected in parallel between the supply node 504 and the mirror transistor 512. In general, field strength current source 516 is adapted to source current at a level corresponding to an n-bit digital control value developed by a counter 518. In the illustrated embodiment wherein n=5, field strength current source 516 is potentially capable of sourcing thirty-two distinct reference current levels. We propose that the initial, minimum reference current level be selected so as to be less than the current carrying capacity of the mirror transistor 512 when the shunt circuit 502 first begins to shunt excess induced current through reference transistor 510; that the maximum reference current level be selected so as to be greater than the current carrying capacity of the mirror transistor 512 when the shunt circuit 502 is shunting a maximum anticipated amount of excess induced current; and that the intermediate reference current levels be distributed relatively evenly between the minimum and maximum levels. Of course, alternate schemes may be practicable, and, perhaps, desirable depending on system requirements.

Within control 518, a conventional analog-to-digital converter (ADC) 520, having its input connected to a sensing node 514, provides a digital output indicative of the field strength reference voltage, $v_R$, developed on sensing node 514. In one embodiment, ADC 520 may comprise a comparator circuit adapted to switch from a logic_0 state to a logic_1 when sufficient current is sourced by field strength current source 516 to raise the voltage on sensing node 514 above a predetermined reference voltage threshold, $v_{th}$. Alternatively, ADC 520 may be implemented as a multi-bit ADC capable of providing higher precision regarding the specific voltage developed on sensing node 514, depending on the requirements of the system. Sufficient current may be characterized as that current sourced by the field strength current source 516 or sunk by mirror transistor 512 such that the voltage on sensing node 514 is altered substantially above or below a predetermined reference voltage threshold, $v_{th}$. In the exemplary case of a simple CMOS inverter, $v_{th}$ is, in its simplest form, one-half of the supply voltage (VDD/2). Those skilled in the art will appreciate that $v_{th}$ may by appropriately modified by altering the widths and lengths of the devices of which the inverter is comprised. In the exemplary case a multi-bit ADC, $v_{th}$ may be established by design depending on the system requirements and furthermore, may be programmable by the system.

In the illustrated embodiment, a latch 522 captures the output state of ADC 520 in response to control signals provided by a clock/control circuit 524. If the captured state is logic 0, the clock/control circuit 524 will change counter 518 to change the reference current being sourced by field strength current source 516; otherwise clock/control circuit 524 will, at least temporarily, cease operation. However, notwithstanding, the digital field-strength value developed by counter 518 is available for any appropriate use, as discussed above.

Figure 6:
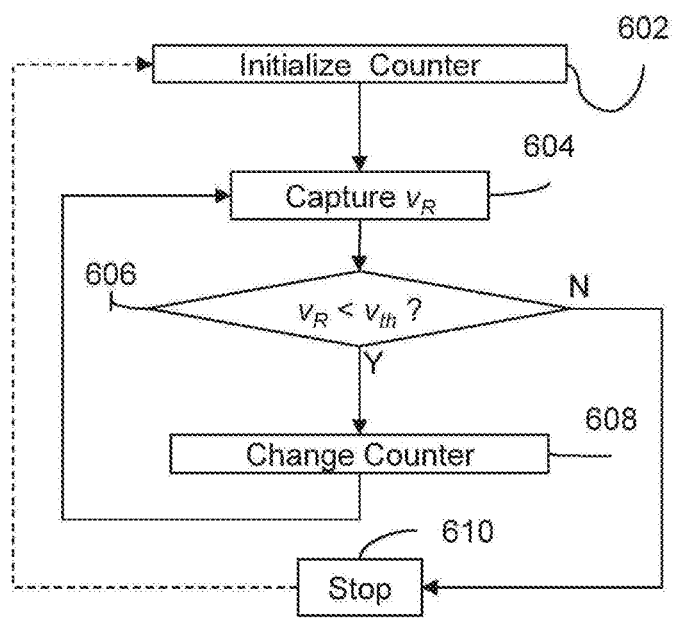
FIG. 6 illustrates, in flow diagram form, the sequencing of operations in the field strength detector circuit shown in FIG. 5.

By way of example, we have illustrated in FIG. 6 one possible general operational flow of a field strength detector in accordance with embodiments of the present disclosure. Upon activation, counter 518 is set to its initial digital field-strength value (step 602), thereby enabling field strength current source 516 to initiate reference current sourcing at the selected level. After an appropriate settling time, the field strength reference voltage, $v_R$, developed on sensing node 514 and digitized by ADC 520 is captured in latch 522 (step 604). If the captured field strength reference voltage, $v_R$, is less than (or equal to) the predetermined reference threshold voltage, $v_{th}$, clock/control 524 will change counter 518 (step 606). This process will repeat, changing the reference current sourced by field strength current source 516 until the captured field strength reference voltage, $v_R$, is greater than the predetermined reference threshold voltage, $v_{th}$ (at step 608), at which time the process will stop (step 610). As illustrated, this sweep process can be selectively reactivated as required, beginning each time at either the initial field-strength value or some other selected value within the possible range of values as desired.

Figure 7:
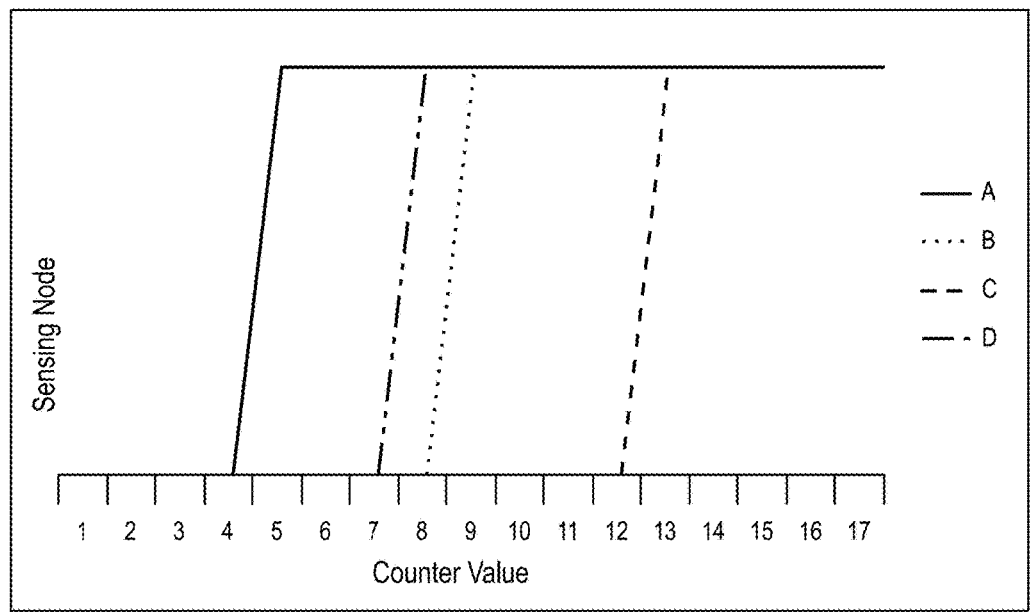
FIG. 7 illustrates, in graph form, the response of the field strength detector circuit shown in FIG. 5 to various conditions.

The graph illustrated in FIG. 7 depicts several plots of the voltage developed on sensing node 514 as the field strength detector circuit 400 sweeps the value of counter 518 according to the flow illustrated in FIG. 6. As an example, note that the curve labeled "A" in FIG. 5 begins at a logic_0 value when the value of counter 38 is at a minimum value such as "1" as an exemplary value. Subsequent loops through the sweep loop gradually increase the field strength reference voltage on sensing node 514 until counter 38 reaches a value of "4" as an example. At this point, the "A" plot in FIG. 5 switches from a logic_0 value to a logic_1 value, indicating that the field strength reference voltage, $v_R$, on sensing node 514 has exceeded the predetermined reference threshold voltage, $v_{th}$. Other curves labeled "B" through "D" depict incremental increases of reference currents, $i_R$, flowing through reference device 510, resulting in correspondingly higher mirrored currents flowing through mirror device 512. This incrementally higher mirror current requires field strength current source 406 to source a higher current level which in turn corresponds to higher values in counter 518. Thus, it is clear that embodiments of the present disclosure are adapted to effectively and efficiently develop a digital representation of the current flowing through sensing node 514 that is suitable for any appropriate use.

Figure 8:
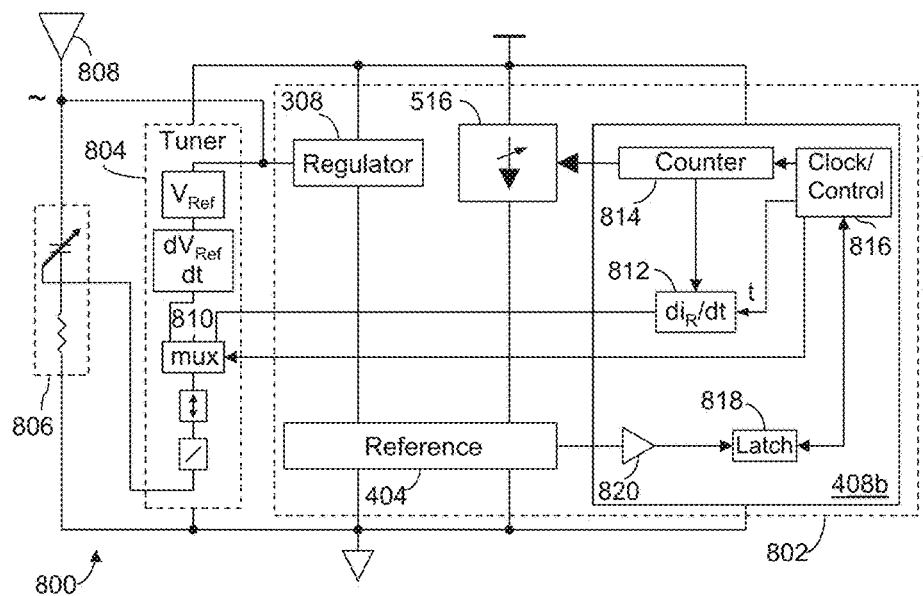
FIG. 8 illustrates, in block schematic form, an RF receiver circuit constructed in accordance with another embodiment of the present disclosure.

One such use, as discussed earlier, of our field strength detector 310 is to cooperate with tuner 306 in controlling the operating characteristics of the tank circuit 304. FIG. 8 illustrates one possible embodiment where receiver circuit 800 uses a field strength detector 802 specially adapted to share with tuner 804 the control of the tank circuit 806. Dynamically tuning, via tuner 306a, the tank circuit 806 allows one to dynamically shift the/R of the tank circuit 806 to better match the $f_C$ of the received RF signal at antenna 808. FIG. 8 adds a multiplexer 810 to tuner 804 to facilitate shared access to the tuner control apparatus. Shown in FIG. 9 is the operational flow of field strength detector 800 upon assuming control of tank circuit 806.

Figure 9:
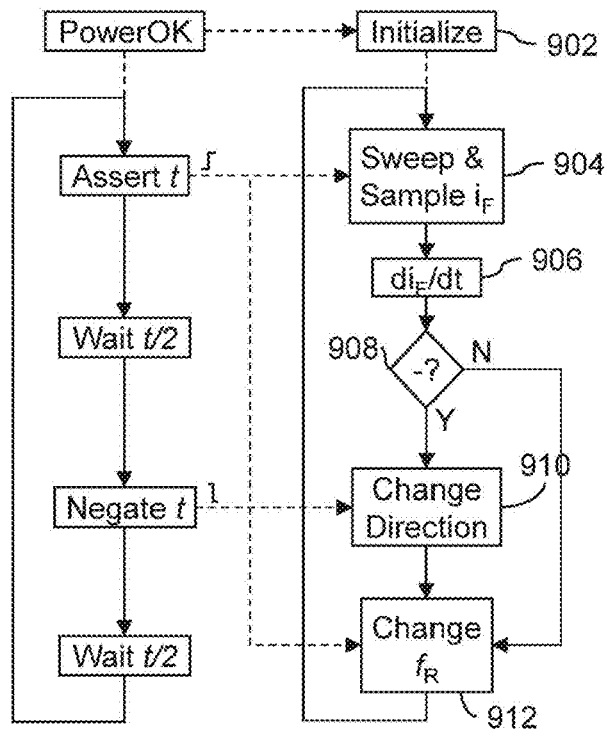
FIG. 9 illustrates, in flow diagram form, the sequencing of the operations in the RF receiver circuit shown in FIG. 8.

In context of this particular use, once tuner 804 has completed its initial operating sequences, and field strength detector 500 has performed an initial sweep (as described above and illustrated in FIG. 6) and saved in a differentiator 812 a base-line field-strength value developed in counter 814, clock/control 816 commands multiplexer 810 to transfer control of the tank circuit 806 to field strength detector 802 (all comprising step 902 in FIG. 9). Upon completing a second current sweep, differentiator 812 will save the then-current field-strength value developed in the counter 814 (step 904). Thereafter, differentiator 812 will determine the polarity of the change of the previously saved field-strength value with respect to the then-current field-strength value developed in counter 814 (step 906). If the polarity is negative (step 908), indicating that the current field-strength value is lower than the previously-saved field strength value, differentiator 812 will assert a change direction signal; otherwise, differentiator 812 will negate the change direction signal (step 91 0). In response, the shared components in tuner 804 downstream of the multiplexer 810 will change the tuning characteristics of tank circuit 806 (step 912). Now, looping back (to step 904), the resulting change of field strength, as quantized is the digital field-strength value developed in counter 814 during the next sweep (step 904), will be detected and, if higher, will result in a further shift in the $f_R$ of the tank circuit 806 in the selected direction or, if lower, will result in a change of direction (step 91 0). Accordingly, over a number of such 'seek' cycles, embodiments of the present disclosure will selectively allow the receiver 800 to maximize received field strength even if, as a result of unusual factors, the $f_R$ of the tank circuit 806 may not be precisely matched to the $f_C$ of the received RF signal, i.e., the reactance of the antenna is closely matched with the reactance of the tank circuit, thus achieving maximum power transfer. In an alternative embodiment, it would be unnecessary for tuner 804 to perform an initial operating sequence. Rather, field strength detector 802 may be used exclusively to perform both the initial tuning of the receiver circuit 800 as well as the subsequent field strength detection. Note that the source impedance of antenna 808 and load impedance of tank circuit 806 may be represented alternatively in schematic form as in FIG. 10, wherein antenna 808 is represented as equivalent source resistance $R_S$ 1002 and equivalent source reactance $X_S$ 1004, and tank circuit 806 is represented as equivalent load resistance $R_L$ 1006 and equivalent, variable load reactance $X_L$ 1008.

Figure 11:
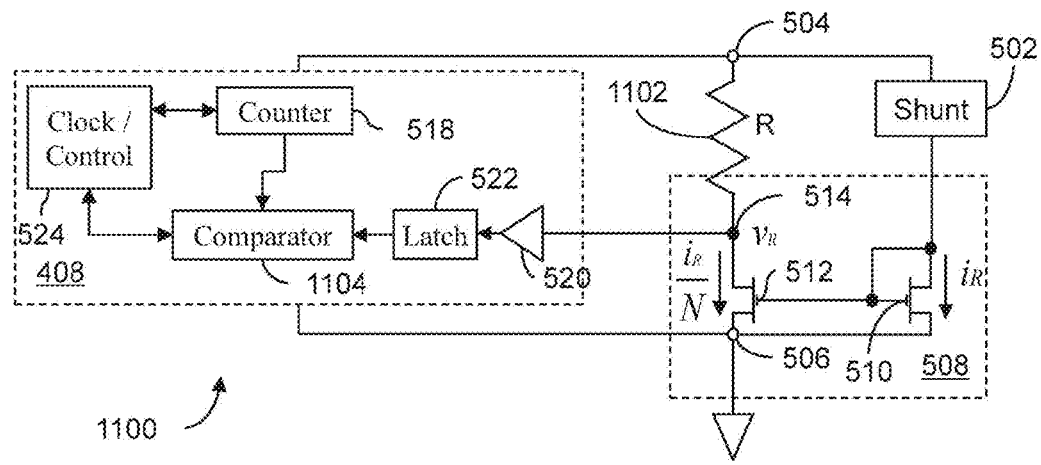
FIG. 11 illustrates, in block schematic form, an alternative exemplary embodiment of the field strength detector circuit shown in FIG. 5.

FIG. 11 illustrates alternate embodiments of a field strength detector 1100, previously discussed with reference to FIG. 5. Here, as before, shunt circuit 502 is used to develop a substantially constant operating voltage level across supply node 504 and ground node 506. Also as before, the current reference 516 is implemented as a current mirror circuit 508 connected in series with shunt circuit 502 between nodes 504 and 506. However, in this embodiment, the field strength current source comprises a resistive component 1102 adapted to function as a static resistive pull-up device. Many possible implementations exist besides a basic resistor, such as a long channel length transistor, and those skilled in the art will appreciate the various implementations that are available to accomplish analogous functionality. The field strength voltage reference vR developed on sensing node 514 will be drawn to a state near the supply voltage when the mirrored current flowing through transistor 512 is relatively small, e.g. close to zero amps, indicating a weak field strength. As the field strength increases, the current flowing through mirror transistor 512 will increase, and the field strength voltage reference VR developed on sensing node 514 will drop proportionally to the mirrored current flowing through mirror transistor 512 as $i_R$/N. ADC 40, having its input connected to sensing node 514, provides a digital output indicative of the field strength reference voltage, $v_R$, developed on sensing node 514, as described previously.

In this alternate embodiment, latch 42 captures the output state of ADC 40 in response to control signals provided by a clock/control circuit 524. As disclosed earlier, the ADC 40 may comprise a comparator circuit. In this instance, ADC 40 is adapted to switch from a logic 1 state to a logic_0 when sufficient current is sunk by mirror transistor 512 to lower the voltage on sensing node 514 below a predetermined reference voltage threshold, $v_{th}$. Alternatively, ADC 40 may be implemented as a multi-bit ADC capable of providing higher precision regarding the specific voltage developed on sensing node 514, depending on the requirements of the system.

Comparator 1104 subsequently compares the captured output state held in latch 520 with a value held in counter 518 that is selectively controlled by clock/control circuit 524. In response to the output generated by comparator 1104, clock/control circuit 524 may selectively change the value held in counter 518 to be one of a higher value or a lower value, depending on the algorithm employed. Depending upon the implementation of counter 518 and comparator 1104, clock/control circuit 524 may also selectively reset the value of counter 518 or comparator 1104 or both. The digital field-strength value developed by counter 518 is available for any appropriate use, as discussed above.

Figure 12:
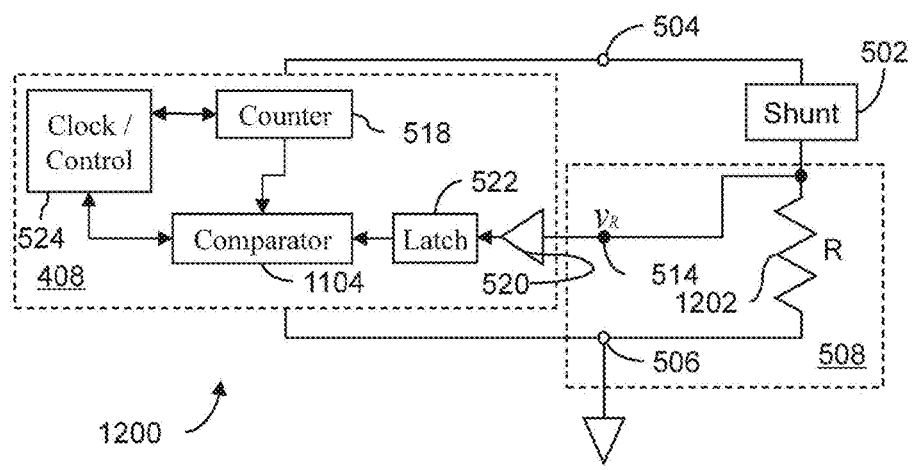
FIG. 12 illustrates, in block schematic form, an alternative exemplary embodiment of the field strength detector circuit shown in FIG. 5.

In FIG. 12 we have illustrated another alternate embodiment of our field strength detector 1200 illustrated in FIG. 5. Here, as before, shunt circuit 502 is used to develop a substantially constant operating voltage level across supply node 504 and ground node 506. In this embodiment, the current reference is implemented as a resistive component 1202 that functions as a static pull-down device. Many possible implementations exist besides a basic resistor, such as a long channel length transistor and those skilled in the art will appreciate the various implementations that are available to accomplish analogous functionality. The field strength voltage reference $v_R$ developed on sensing node 514 will be drawn to a state near the ground node when the current flowing though shunt circuit 502 is relatively small, e.g. close to zero amps, indicating a weak field strength. As the field strength increase, the current flowing through shunt circuit 502 will increase, and the field strength voltage reference vRm developed on sensing node 514 will rise proportionally to the current flowing through shunt circuit 502. ADC 520, having its input connected to a sensing node 514, provides a digital output indicative of the field strength reference voltage, $v_R$, developed on sensing node 514, as described previously.

In this alternate embodiment, latch 522 captures the output state of ADC 520 in response to control signals provided by a clock/control circuit 524. As disclosed earlier, the ADC 520 may comprise a comparator circuit. In this instance, ADC 520 is adapted to switch from a logic_0 state to a logic 1 when sufficient current is sourced by shunt circuit 502 to raise the voltage on sensing node 514 above a predetermined reference voltage threshold, $v_{th}$. Alternatively, ADC 520 may be implemented as a multi-bit ADC capable of providing higher precision regarding the specific voltage developed on sensing node 514, depending on the requirements of the system.

Comparator 1104 subsequently compares the captured output state held in latch 522 with a value held in counter 518 that is selectively controlled by clock/control circuit 524. In response to the output generated by comparator 1104, clock/control circuit 524 may selectively change the value held in counter 518 to be one of a higher value or a lower value, depending on the algorithm employed. Depending upon the implementation of counter 518 and comparator 1104, clock/control circuit 524 may also selectively reset the value of counter 518 or comparator 1104 or both. The digital field strength value developed by counter 518 is available for any appropriate use, as discussed above.

In another embodiment, embodiments of the present disclosure may be adapted to sense the environment to which a tag is exposed, as well as sensing changes to that same environment. The auto-tuning capability of tuner 306 acting in conjunction with tank circuit 304 detects antenna impedance changes. These impedance changes may be a function of environmental factors such as proximity to interfering substances, e.g., metals or liquids, as well as a function of a reader or receiver antenna orientation. Likewise, as disclosed herein, field strength (i.e., received power) detector 310 may be used to detect changes in received power (i.e., field strength) as a function of, for example, power emitted by the reader, distance between tag and reader, physical characteristics of materials or elements in the immediate vicinity of the tag and reader, or the like. Sensing the environment or, at least, changes to the environment is accomplished using one or both of these capabilities.

Figure 13:
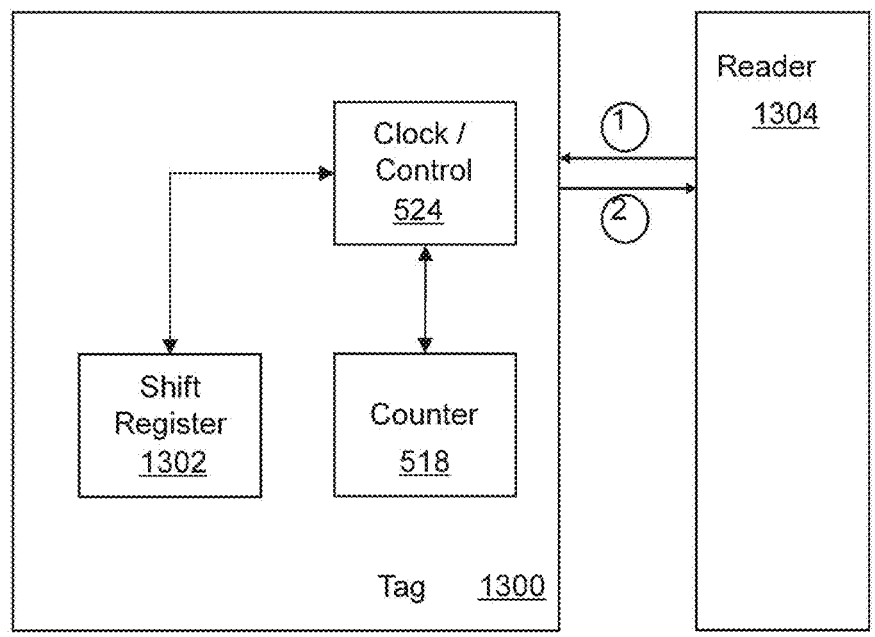
FIG. 13 illustrates, in block schematic form, an exemplary RFID sub-system containing tag and reader.

As an example, the tag 1300 of FIG. 13, contains both a source tag antenna (not shown, but see, e.g., FIG. 8) and a corresponding load chip tank circuit 304 (not shown, but see, e.g., FIG. 8). Each contains both resistive and reactive elements as discussed previously (see, e.g., FIG. 10). Tag 1300 containing such a tank circuit 304 mounted on a metallic surface will exhibit antenna impedance that is dramatically different than the same tag 1300 in free space or mounted on a container of liquid. Shown in Table 1 are exemplary values for impedance variations in both antenna source resistance 1002 as well as antenna source reactance 1004 as a function of frequency as well as environmental effects at an exemplary frequency.

TABLE 1

Antenna Impedance Variations

| | Rs, | Xs, | Rs, | Xs, | Rs, | Xs, | Rs, | Xs, |
|---|---|---|---|---|---|---|---|---|
| | 860 MHz | | 870 MHz | | 880 MHz | | 890 MHz | |
| In Air | 1.3 | 10.7 | 1.4 | 10.9 | 1.5 | 11.2 | 1.6 | 11.5 |
| On Metal | 1.4 | 10.0 | 1.5 | 10.3 | 1.6 | 10.6 | 1.7 | 10.9 |
| On Water | 4.9 | 11.3 | 1.8 | 11.1 | 2.4 | 11.7 | 2.9 | 11.5 |
| On Glass | 1.8 | 11.1 | 2.0 | 11.4 | 2.2 | 11.7 | 2.5 | 12.0 |
| On Acrylic | 1.4 | 10.6 | 1.6 | 11.1 | 1.7 | 11.4 | 1.9 | 11.7 |
| | 900 MHz | | 910 MHz | | 920 MHz | | 930 MHz | |
| In Air | 1.8 | 11.8 | 2.0 | 12.1 | 2.2 | 12.4 | 2.4 | 12.8 |
| On Metal | 1.9 | 11.2 | 2.1 | 11.6 | 2.3 | 12.0 | 2.6 | 12.4 |
| On Water | 2.5 | 12.3 | 3.0 | 12.7 | 5.8 | 14.1 | 9.1 | 13.2 |
| On Glass | 2.8 | 12.4 | 3.2 | 12.8 | 3.7 | 13.2 | 4.2 | 13.6 |
| On Acrylic | 2.0 | 12.1 | 2.3 | 12.4 | 2.5 | 12.8 | 2.8 | 13.2 |

Figure 10:
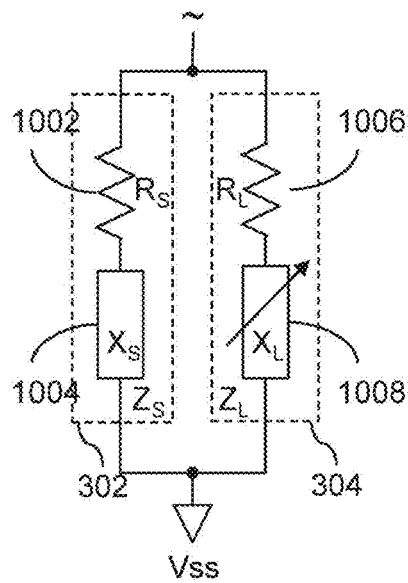
FIG. 10 illustrates, in block schematic form, an alternative representation of the impedance represented by the antenna and the tank circuit of the exemplary RFID receiver circuit.

The tuner circuit 306 of embodiments of the present disclosure automatically adjusts the load impendence by adjusting load reactance 1008 (sc, e.g., FIG. 10

FIG. 8) to match source antenna impedance represented by source resistance 1002 (see, e.g., FIG. 10) and source reactance 1004 (see, e.g., FIG. 1 0). As previously disclosed, matching of the chip load impedance and antenna source impedance can be performed automatically in order to achieve maximum power transfer between the antenna and the chip. A digital shift register 1302 allows selectively changing the value of the load reactive component 1008 (see, e.g., FIG. 1 0), in the present case a variable capacitor, until power transfer is maximized. This digital value of the matched impendence may be used either internally by the tag 1300, or read and used by the reader 1304, to discern relative environmental information to which the tag 1300 is exposed. For example, tag 1300 may contain a calibrated look-up-table within the clock/control circuit 524 which may be accessed to determine the relevant environmental information. Likewise, a RFID reader 1304 may issue commands (see transaction 1 in FIG. 13) to retrieve (see transaction 2 in FIG. 13) the values contained in digital shift register 1302 via conventional means, and use that retrieved information to evaluate the environment to which tag 1300 is exposed. The evaluation could be as simple as referencing fixed data in memory that has already been stored and calibrated, or as complex as a software application running on the reader or its connected systems for performing interpretive evaluations.

Likewise, consider a tag 1300 containing our field strength (i.e., received power) detector 310 (not shown, but, e.g., see FIG. 3) wherein the method of operation of the system containing the tag 1300 calls for field strength detector 310 to selectively perform a sweep function and developing the quantized digital representation of the current via the method discussed earlier. As illustrated in FIG. 13, counter 518 will contain the digital representation developed by our field strength detector 310 of the RF signal induced current, and may be used either internally by the tag 1300, or read and used by the reader 1304, to discern relative environmental information to which the tag 1300 is exposed. For example, reader 1304 may issue a command to the tag 1300 (see transaction 1 in FIG. 13) to activate tuner 306 and/or detector 310 and, subsequent to the respective operations of tuner 306 and/or detector 310, receive (see transaction 2 in FIG. 13) the digital representations of either the matched impedance or the maximum current developed during those operations. Once again, this digital value of the field strength stored in the counter 518 may be used either internally by the tag 1300, or read and used by the reader 1304, to discern relative environmental information to which the tag 1300 is exposed. For example, tag 1300 may contain a calibrated look-up-table within the clock and control block 524 which may be accessed to determine the relevant environmental information. Likewise, a RFID reader may issue commands to retrieve the values contained in digital shift register 1302, and use that retrieved information to evaluate the environment to which tag 1300 is exposed. The evaluation could be as simple as referencing fixed data in memory that has already been stored and calibrated, or as complex as a software application running on the reader or its connected systems for performing interpretive evaluations. Thus, the combining of the technologies enables a user to sense the environment to which a tag 1300 is exposed as well as sense changes to that same environment.

Some environmental factors can change the effective impedance of the RFID antenna. Thus, it is possible to dynamically retune the tank circuit 304 or other like impedance to compensate for the environmentally-induced change in impedance by systematically changing the digital tuning parameters of tank circuit 304. By characterizing the antenna impedance as a function of various factors, one can develop an estimate of the relative change in the environmental factor as a function of the relative change in the digital tuning parameters of the tank circuit 304.

Figure 14:
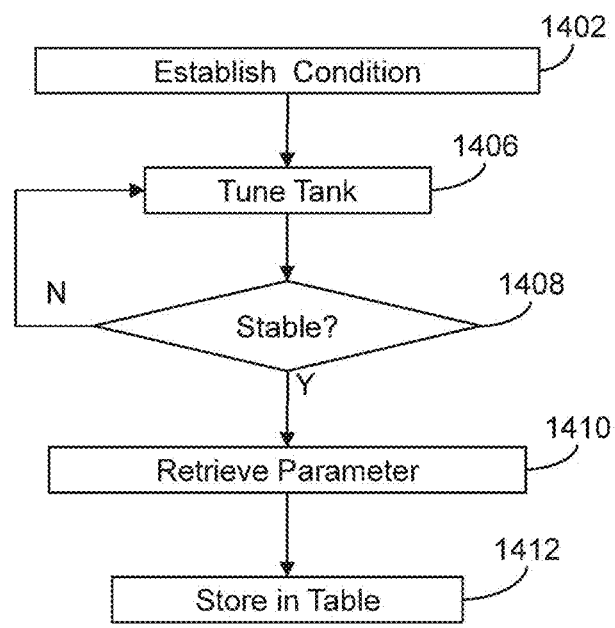
FIG. 14 illustrates, in flow diagram form, the sequencing of the operations in developing a reference table associating tank tuning parameters with system frequency.

As can be seen in Table 1, above, it is possible to develop, a priori, a reference table storing information relating to a plurality of environmental reference conditions. Thereafter, in carefully controlled conditions wherein one and only one environmental condition of interest is varied (see, FIG. 14), an operational tag 1300 is exposed to each of the stored reference conditions (step 1402) and allowed to complete the tank tuning process. (recursive steps 1406 and 1408. After tuning has stabilized, the tag 1300 can be interrogated (step 1410), and the final value in the shift register 1302 retrieved (step 141 0). This value is then stored in the reference table in association with the respective environmental condition (step 1412). The resulting table might look like this:

TABLE 2

Tuning Parameters vs. Frequency

|  | 860 MHz | 870 MHz | 880 MHz | 890 MHz | 900 MHz | 910 MHz | 920 MHz | 930 MHz |
| --- | --- | --- | --- | --- | --- | --- | --- | --- |
| In Air | 25 | 21 | 16 | 12 | 8 | 4 | 0 | 0* |
| On Metal | 31 | 27 | 22 | 17 | 12 | 8 | 3 | 0 |
| On Water | 20 | 19 | 12 | 12 | 4 | 0 | 0* | 0* |
| On Glass | 21 | 17 | 12 | 8 | 4 | 0* | 0* | 0* |
| On Acrylic | 23 | 19 | 14 | 10 | 6 | 2 | 0* | 0* |

0* indicates that a lower code was needed but not available;
0 is a valid code.

In contrast to prior art systems in which the antenna impedance must be estimated indirectly, e.g., using the relative strength of the analog signal returned by a prior art tag 1300 in response to interrogation by the reader 1304, methods of the present disclosure employ the on-chip re-tuning capability of our tag 1300 to return a digital value which more directly indicates the effective antenna impedance. Using a reference table having a sufficiently fine resolution, it is possible to detect even modest changes in the relevant environmental conditions. It will be readily realized by practitioners in this art that, in general applications, environment conditions typically do not change in an ideal manner, and, more typically, changes in one condition are typically accompanied by changes in at least one other condition. Thus, antenna design will be important depending on the application of interest.

One possible approach mounts the antenna on a substrate that tends to amplify the environmental condition of interest, e.g., temperature.

Figure 15A:
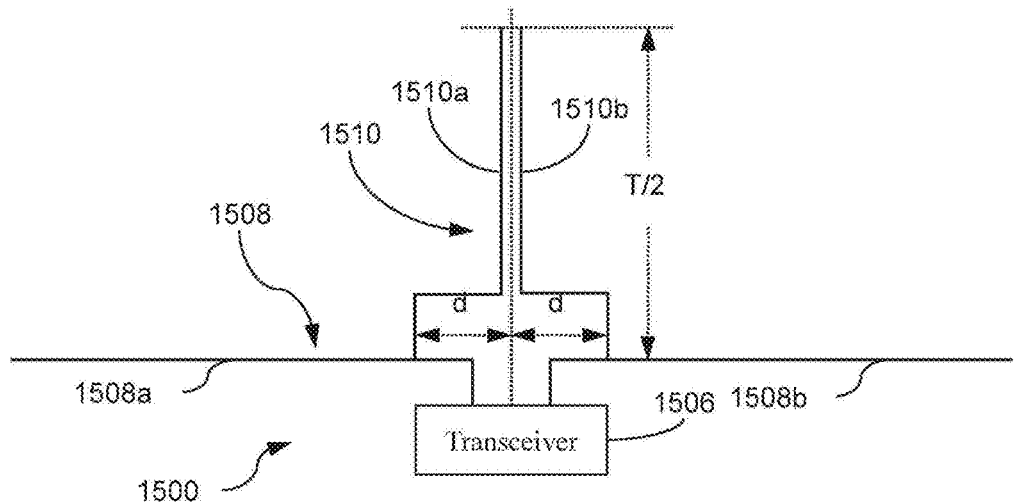
FIGS. 15A and 15B illustrate an RF system constructed in accordance with one embodiment of the present disclosure to sense environmental conditions in a selected region surrounding the system.
Figure 15B:
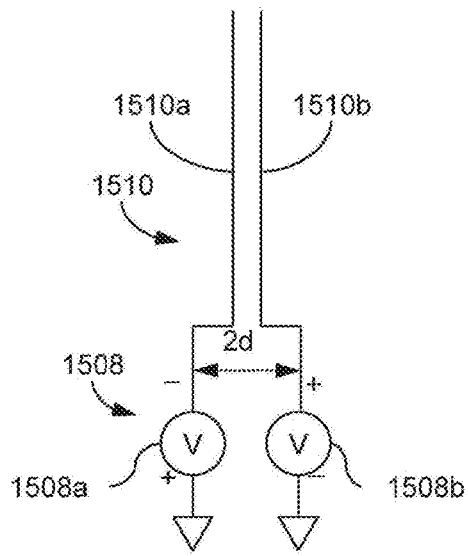

Shown in FIGS. 15A and 15B is an RF sensing system 1500 constructed in accordance with one embodiment of embodiments of the present disclosure, and specially adapted to facilitate sensing of one or more environmental conditions in a selected region surrounding the system 1500. In general, the system 1500 comprises: an RF transceiver 1506; a di-pole antenna 1508 comprising a pole 1508a and an anti-pole 1508b; and a tail 1510 of effective length T, comprising respective transmission line pole 1510a and transmission line anti-pole 1510b, each of length T/2. In accordance with embodiments of the present disclosure, the differential transmission line elements 1510a-1510b are symmetrically coupled to respective poles 1508a-1508b at a distance d from the axis of symmetry of the antenna 1508 (illustrated as a dotted line extending generally vertically from the transceiver 1506). In general, d determines the strength of the interaction between the transmission line 1510 and the antenna 1508, e.g., increasing d tends to strengthen the interaction. In the equivalent circuit shown in FIG. 15B, the voltage differential between the complementary voltage sources 1508a and 1508b tends to increase as d is increased, and to decrease as d is decreased. Preferably d is optimized for a given application. However, it will be recognized that the sensitivity of the antenna may be degraded as a function of d if a load, either resistive or capacitive, is imposed on the tail 1510.

In operation, the tail 1510 uses the transmission line poles 1510a-1510b to move the impedance at the tip of the tail 1510 to the antenna 1508, thus directly affecting the impedance of the antenna 1508. Preferably, the transceiver 1506 incorporates our tuning circuit 306 so as to detect any resulting change in antenna impedance and to quantize that change for recovery, e.g., using the method we have described above with reference to FIG. 14.

Figure 16:
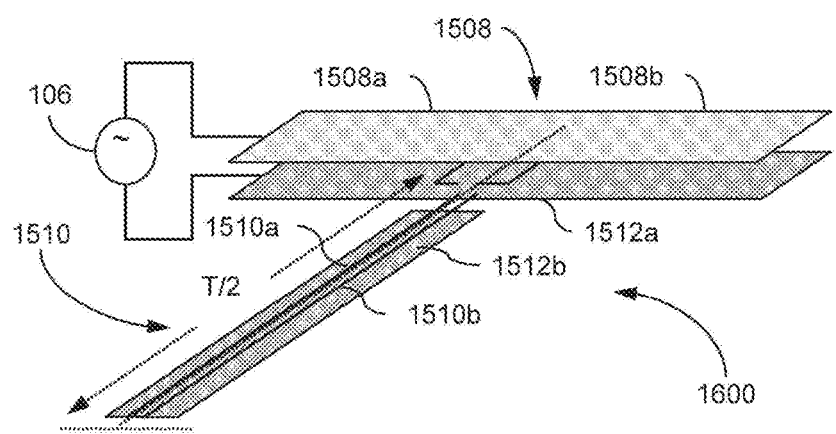
FIG. 16 illustrates, in perspective, exploded view, one possible configuration of an antenna and tail arrangement adapted for use in the system of FIGS. 15A and 15B.
Figure 17A:
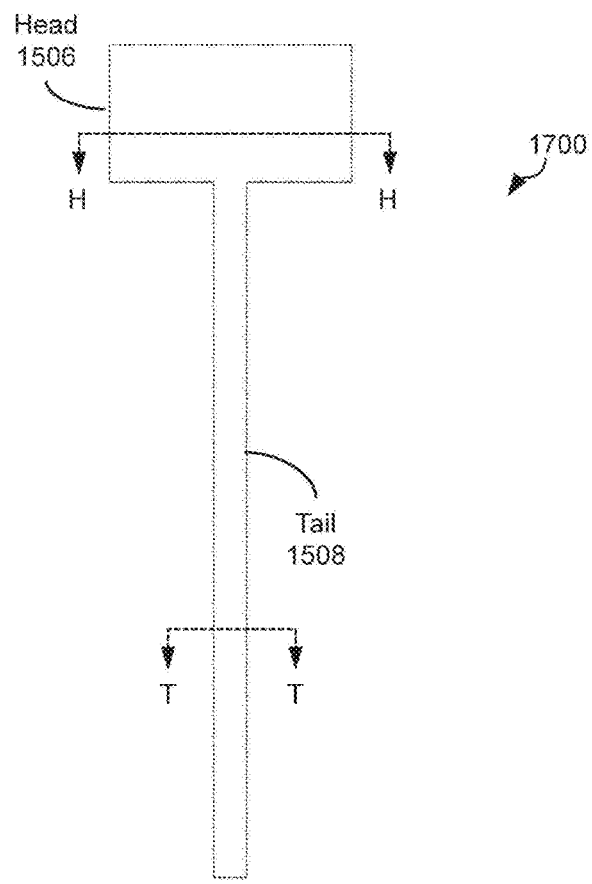
FIG. 17A illustrates in top plan view a fully assembled antenna.
Figure 17B:
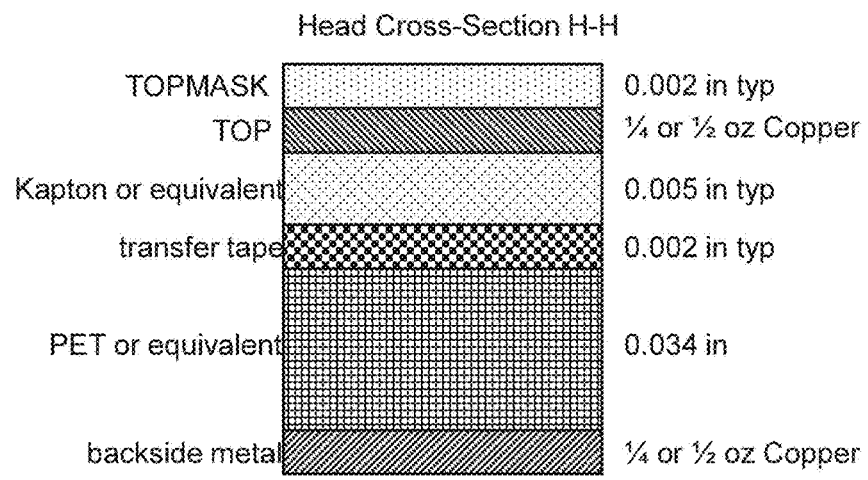
FIG. 17B and FIG. 17C illustrate, in cross-section, the several layers comprising a head and a tail portion, respectively, of the antenna.
Figure 17C:
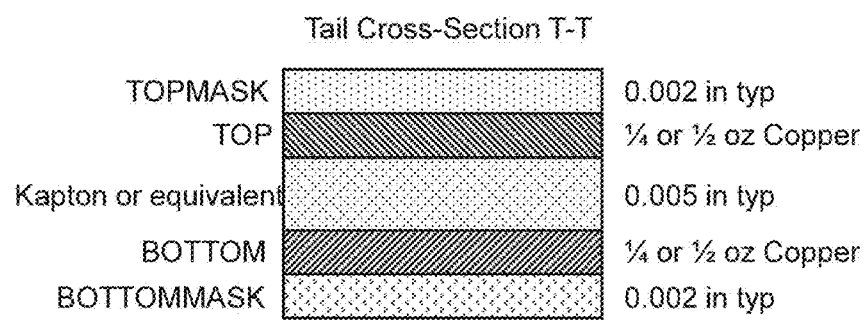
Figure 17D:
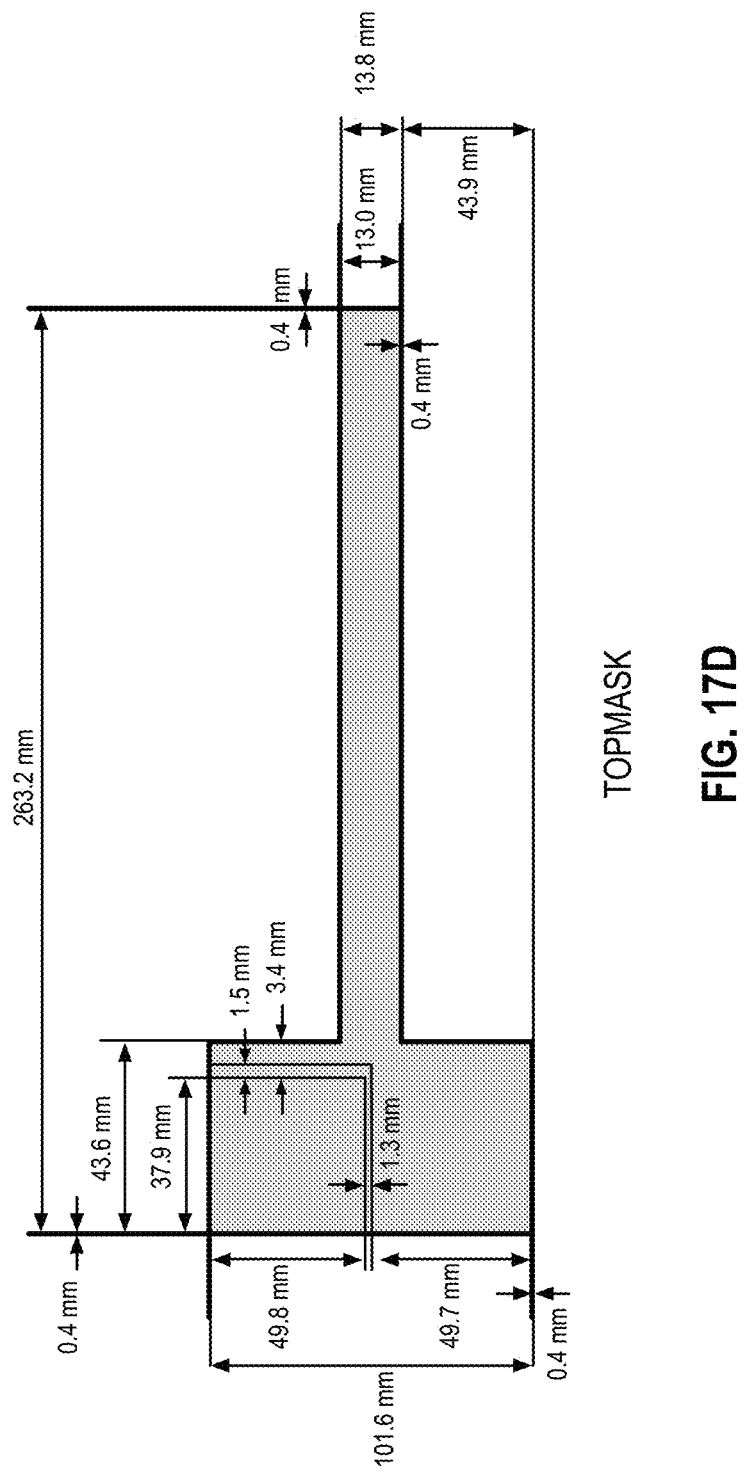
FIG. 17D through FIG. 17G illustrate, in plan view, the several separate layers of the antenna as shown in FIG. 17B and FIG. 17C.
Figure 17E:
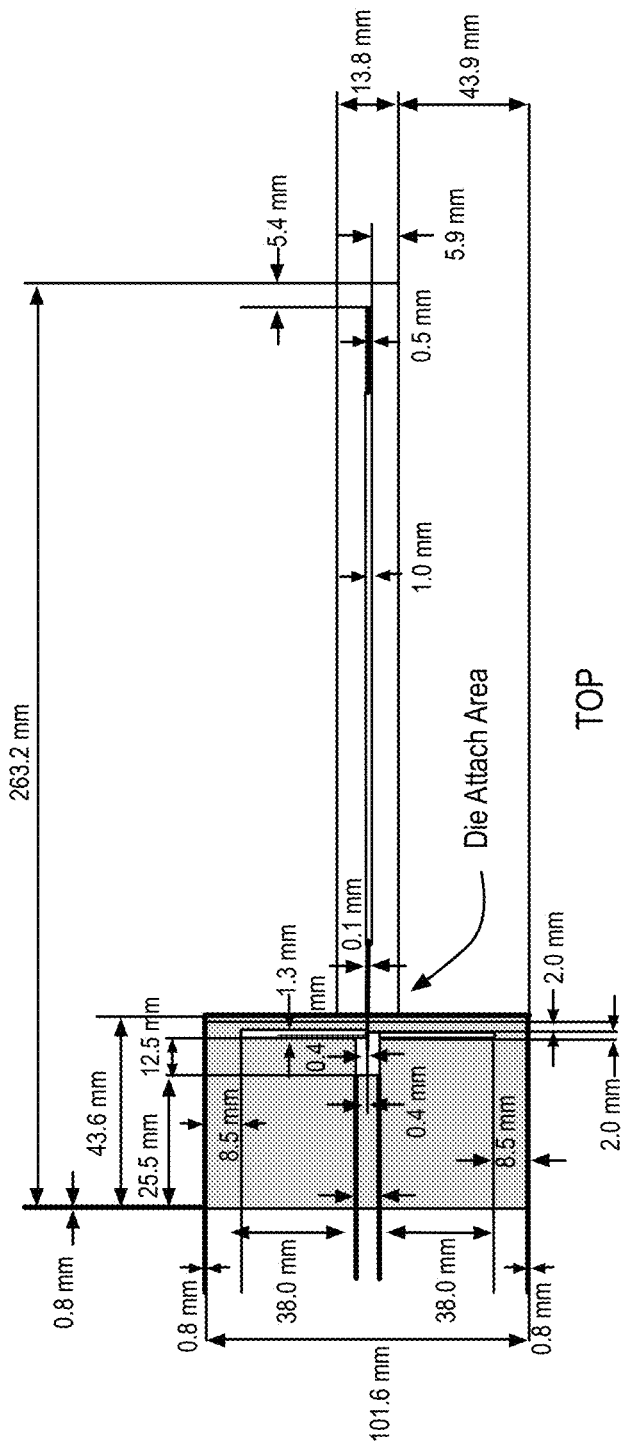
Figure 17F:
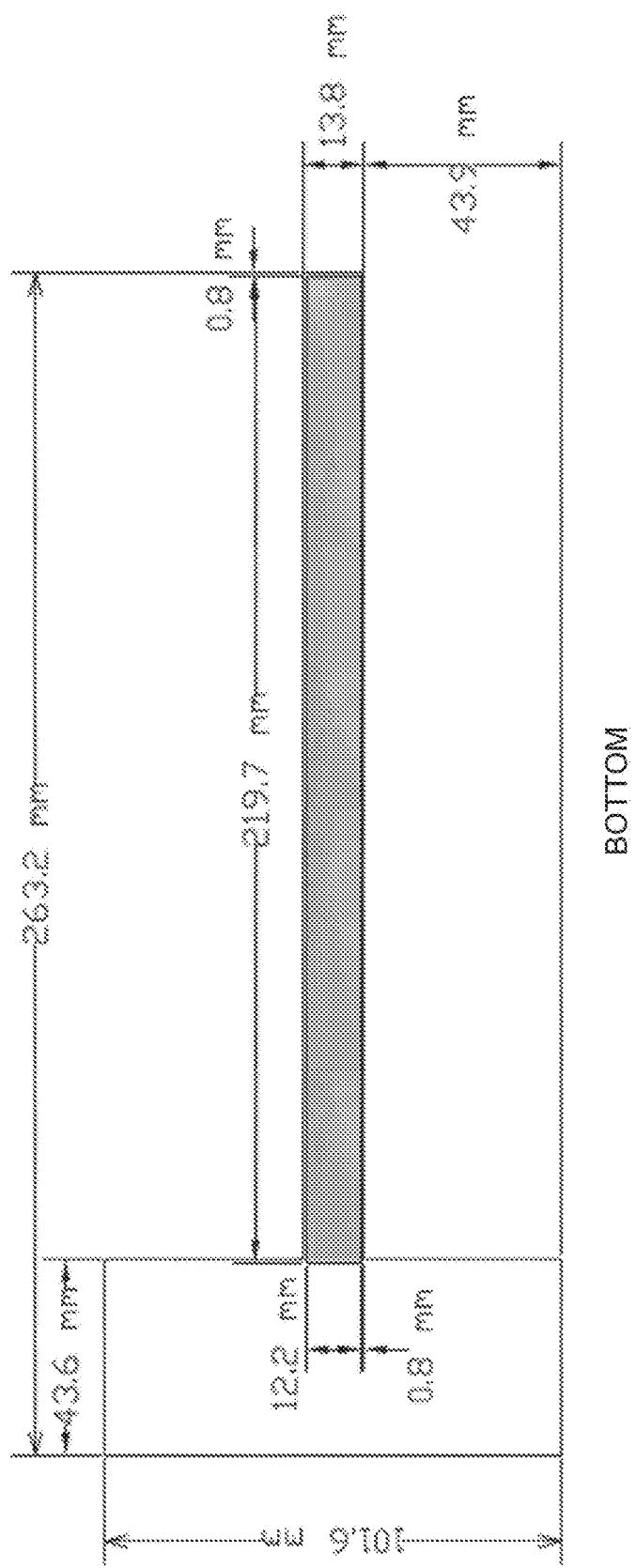
Figure 17G:
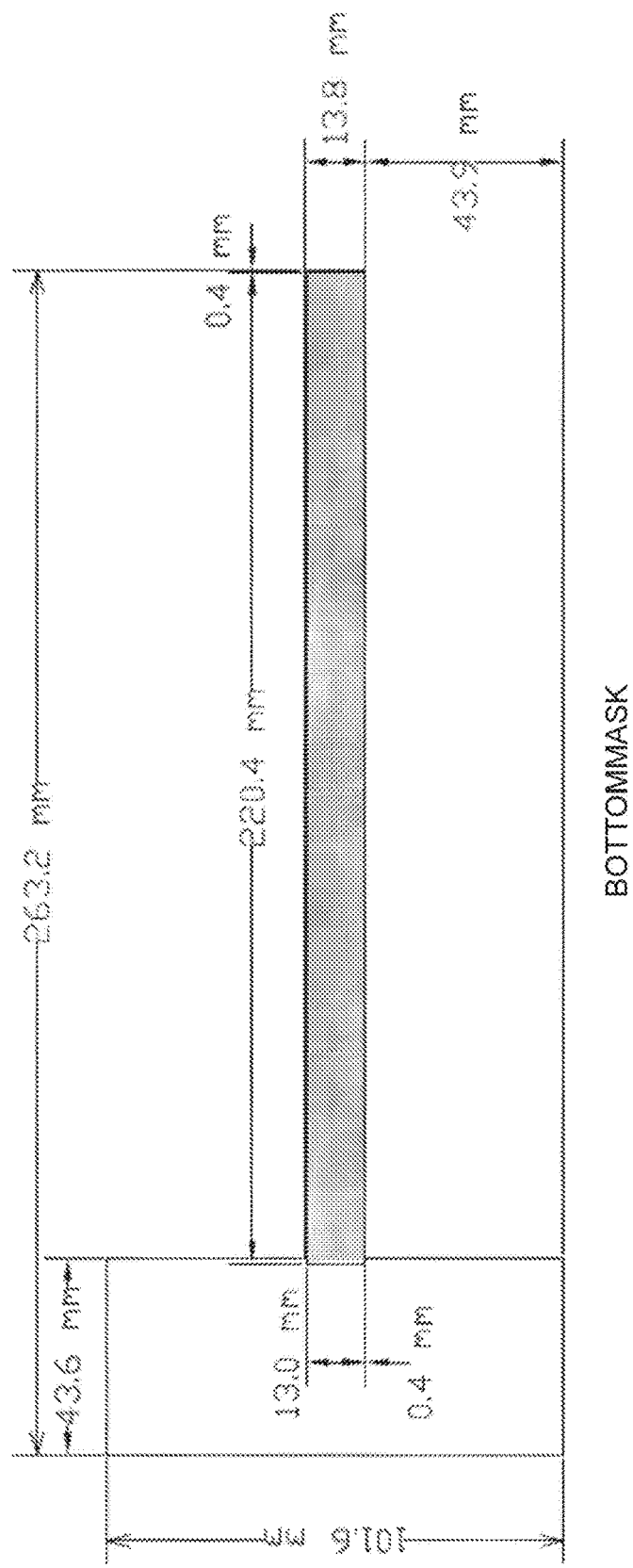
Figure 17H:
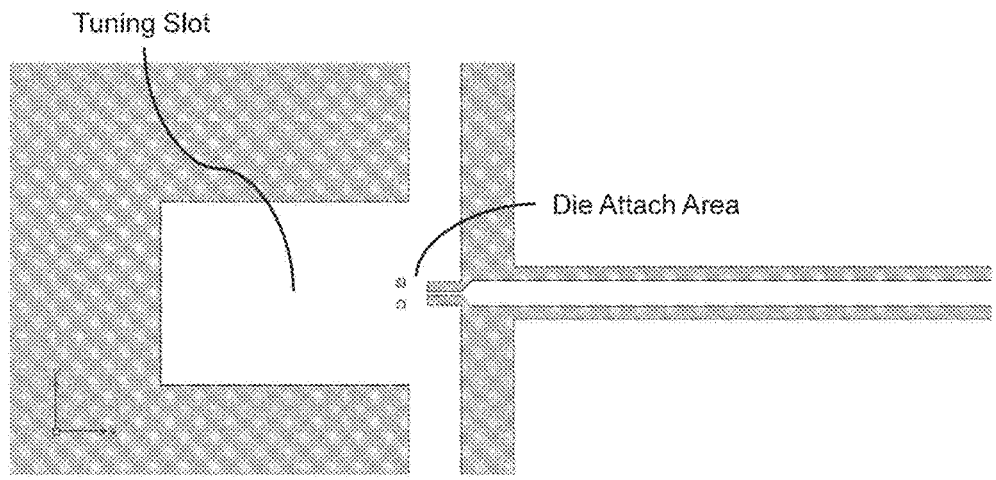
FIG. 17H illustrates, in partial in partial plan view, a close-up depiction of a central, slot portion of the antenna of FIG. 17A (as noted in FIG. 17E) showing in greater detail the construction of antenna elements to which an RFID tag may be attached.

FIG. 16 illustrates one possible embodiment of the system 1600 in which the antenna poles 1508a-1508b are instantiated as a patch antenna (illustrated in light grey), with the antenna pole 1508a connected to one output of transceiver 1506, and the other output of transceiver 1506 connected to the antenna anti-pole 1508b. A ground plane 1512a (illustrated in a darker shade of grey than the patch antenna 1508) is disposed substantially parallel to both the antenna poles 1508a-1508b and a ground plane 1512b disposed substantially parallel to the transmission line poles 1510a-1510b. As is known, the ground planes 1512 are separated from the poles by a dielectric substrate (not shown), e.g., conventional flex material or the like. If the dielectric layer between the antenna poles 1508 and ground plane 1512a is of a different thickness than the layer between the transmission line poles 151 0 and the ground plane 1512b, the ground plane 1512b may be disconnected from the ground plane 1512a and allowed to float. In general, this embodiment operates on the same principles as described above with reference to FIGS. 15A and 15B.

Shown in FIGS. 17 A-H is an antenna constructed in accordance with one other embodiment of embodiments of the present disclosure, and specially adapted for use in the sensing system to facilitate sensing the presence of fluids; and, in particular, to the depth of such fluids. In the illustrated embodiment, antenna 1700 comprises a head portion 1506 and a tail portion 1508. In general, the head 1506 is adapted to receive RF signals and to transmit responses using conventional backscatter techniques; whereas the tail portion 1508 functions as a transmission line. During normal operation, the tail 1508 acts to move and transform the impedance at the tip of the tail to the head 1506. Accordingly, any change in the tip impedance due to the presence of fluid will automatically induce a concomitant change in the impedance of the head antenna 1506. As has been explained above, a tuning circuit will detect that change and re-adjust itself so as to maintain a reactive impedance match. As has been noted above, any such adjustment is reflected in changes in the digital value stored in shift register 1302 (FIG. 13).

Figure 18:
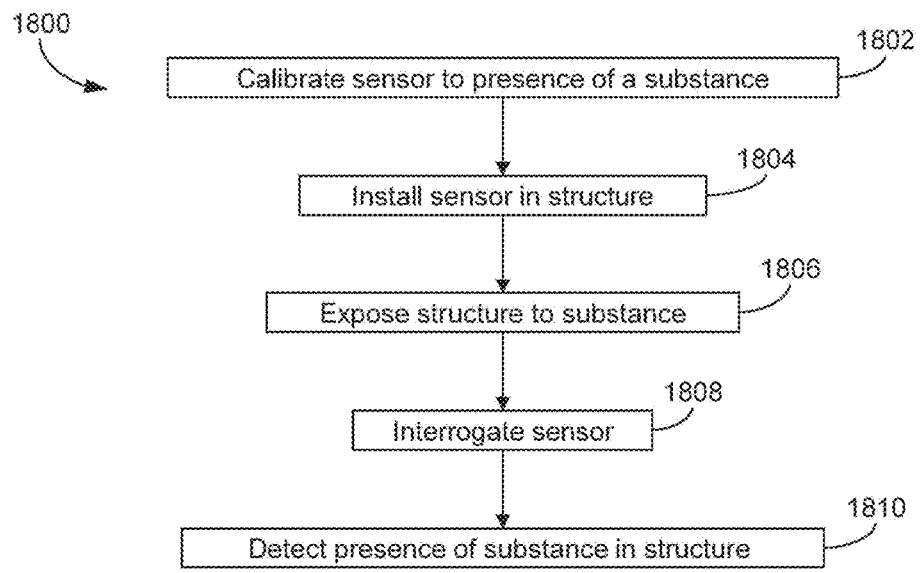
FIG. 18 illustrates, in flow diagram form, the sequencing of the operations in detecting the presence of a contaminant using, e.g., the antenna of FIG. 17A.

Shown in FIG. 18 is one possible flow for a sensing system 1500 using the antenna 114. As has been explained above with reference to FIG. 14, operations 1800 begins with the sensor being first calibrated (step 1802 to detect the presence of varying levels of a particular substance. For the purposes of this discussion, we mean the term substance to mean any physical material, whether liquid, particulate or solid, that is: detectable by the sensor; and to which the sensor demonstrably responds. By detectable, we mean that, with respect to the resonant frequency of the antenna in the absence of the substance, the presence of the substance in at least some non-trivial amount results in a shift in the resonant frequency of the antenna, thereby resulting in a concomitant adjustment in the value stored in the shift register 1302; and by demonstrably responds we mean that the value stored in the shift register 1302 varies as a function of the level the substance relative to the tip of the tail 1506 of the antenna 1700. Once calibrated, the sensor can be installed in a structure (step 1804), wherein the structure can be open, closed or any condition in between. The structure can then be exposed to the substance (step 1806), wherein the means of exposure can be any form appropriate for both the structure and the substance, e.g., sprayed in aerosol, foam or dust form, immersed in whole or in part in a liquid, or other known forms. Following a period of time deemed appropriate for the form of exposure, the sensor is interrogated (step 1808) and the then-current value stored in the shift register 1302 retrieved. By correlating this value with the table of calibration data gathered in step 1802, the presence or absence of the substance can be detected (step 181 0).

In one embodiment, the table of calibration data can be stored in the sensor and selectively provided to the reader during interrogation to retrieve the current value. Alternatively, the table can be stored in, e.g., the reader and selectively accessed once the current value has been retrieved. As will be clear, other embodiments are possible, including storing the table in a separate computing facility adapted to selectively perform the detection lookup when a new current value has been retrieved.

Assume by way of example, an automobile assembly line that includes as an essential step the exposure, at least in part, of a partially-assembled automobile chassis to strong streams of a fluid, e.g., water, so as to determine the fluid-tightness of the chassis. Given the complexity of a modern automobile, it is not cost effective to manually ascertain the intrusion of the fluid at even a relatively small number of possible points of leakage. However, using our sensors and sensing system, it is now possible to install relatively large numbers of independently-operable sensors during the assembly process, even in highly inaccessible locations such as largely-enclosed wiring channels and the like. In the course of such installations, the unique identity codes assigned to each installed sensor is recorded together with pertinent installation location details. After extraction from the immersion tank, the chassis can be moved along a conventional conveyor path past an RFID reader sited in a position selected to facilitate effective querying of all of the installed sensors. In one embodiment, the reader may be placed above the moving chassis so as to "look down" through the opening provided for the front windshield (which may or may not be installed) into the interior portion of the chassis; from such a position even those sensors installed in the "nooks and crannies" in the trunk cavity should be readable. By correlating the code read from each sensor with the previously constructed, corresponding table, it is now possible to detect the presence (or absence) of the substance at the respective location of that sensor, indeed, if the sensor is sufficiently sensitive to the substance, it may be possible to estimate the severity of the leakage in the vicinity of each sensor.

Figure 19:
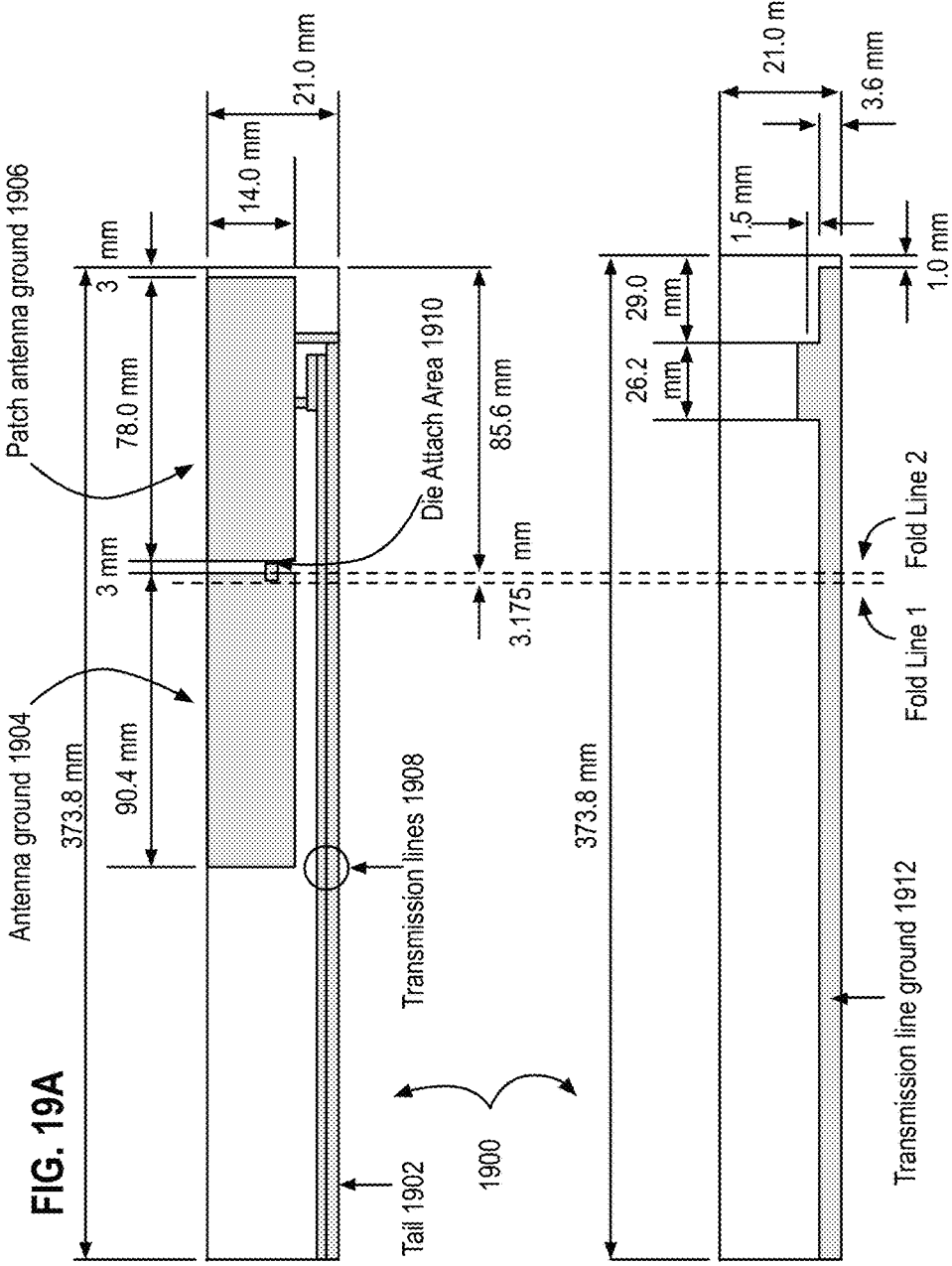
FIG. 19A illustrates, in plan view, the top layer of the antenna after placement of the RFID tag die but before folding along fold lines 1 and 2.
FIG. 19B illustrates, also in plan view, the bottom layer of the antenna as shown in FIG. 19A.

Shown in FIG. 19 is an antenna 1900 constructed in accordance with an embodiment of the present disclosure, and specially adapted for use in the sensing system 1500 to facilitate sensing the presence of fluids; and, in particular, to the depth of such fluids. As illustrated in FIG. 19A, the top layer of antenna 1900 comprises: a patch antenna portion 1906; an antenna ground plane 1904; a tail portion 1908; and a die attach area 1910. As noted in FIG. 19A, the tail portion 1908 comprises a pair of generally parallel transmission lines each substantially the same in length. As illustrated in FIG. 19B, the bottom layer of antenna 1900 comprises a ground plane for the transmission lines 1912. During a typical assembly process, the illustrated shapes are formed in the top and bottom layers of a continuous roll of copper-clad flex circuit material, and each antenna 1900 cut from the roll using a rolling cutter assembly. An RFID tag device (incorporating a tuning circuit) is then attached to the die attach area 1910, and the antenna 1900 is folded along fold lines 1 and 2 generally around a suitable core material such as PET or either open-cell or closed-cell foam.

In general, the patch antenna portion 1906 is adapted to receive RF signals and to transmit responses using conventional backscatter techniques. During normal operation, the transmission lines 1908 comprising the tail 1902 act to move and transform the impedance at the tip of the tail 1902 to the patch antenna 1906. Accordingly, any change in the tip impedance due to the presence of fluid will automatically induce a concomitant change in the impedance of the head antennal. As has been explained above, our tuning circuit 306 will detect that change and re-adjust itself so as to maintain a reactive impedance match. As has been noted above, any such adjustment is reflected in changes in the digital value stored in shift register 1302 (FIG. 13).

Figure 20:
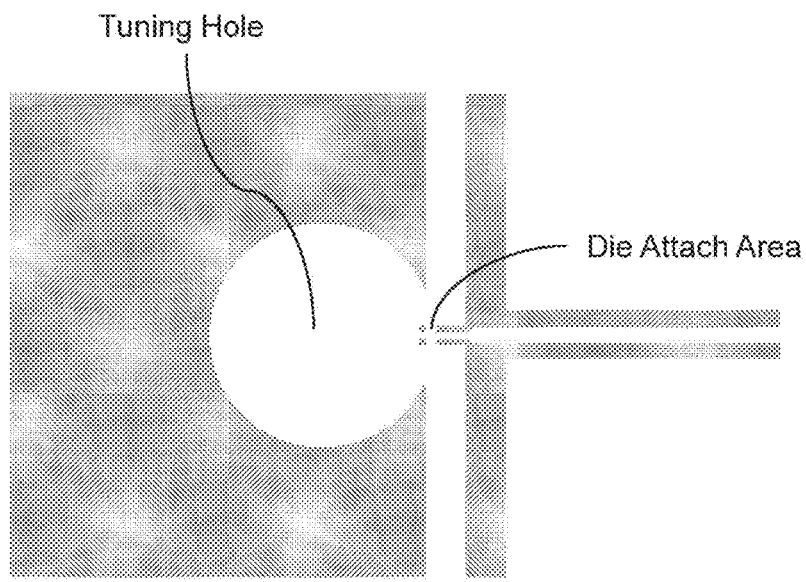
FIG. 20 is depiction of an antenna inlay that may be used m accordance with embodiments of the present disclosure.

FIG. 20 is depiction of an antenna inlay that may be used in accordance with embodiments of the present disclosure.

Figure 21:
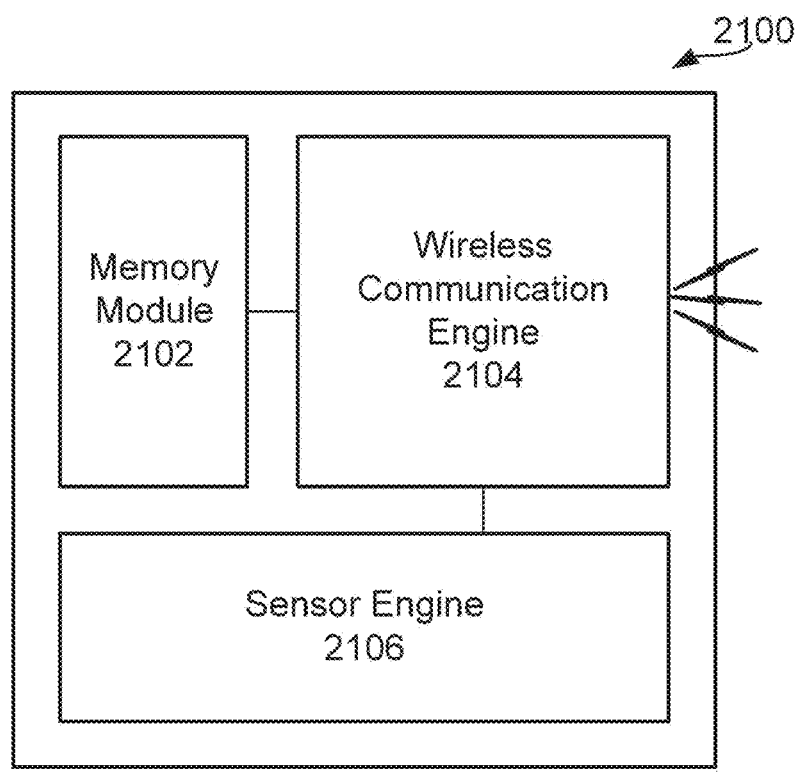
FIG. 21 is a block diagram of a RFID wireless solution provided by embodiments of the present disclosure.

FIG. 21 is a block diagram of a RFID wireless solution provided by embodiments of the present disclosure. Integrated circuit (I C) 21 00 comprises a memory module 21 02, a wireless communication engine 2104, and a sensor engine 2106 which includes an antenna 2108. I C 21 00 is capable of sensing a change in the environmental perimeters proximate to I C 21 00 via impedance changes associated with antenna 2108. In other embodiments a proximity sensor may be employed to determine the proximity of IC 2100 to a given location or RFID reader by tuning the antenna 2108 and an associated tunable impedance. Memory module 2102 is coupled with both the wireless communication engine 2104 and sensor engine 2106. Memory module 2102 is capable of storing information and data gathered by sensor engine 2106 and communicated via wireless communication engine 2104. Further, wireless communication engine 2104 and sensor engine 2106 may be fully programmable via wireless methods. Passive RFID sensors of FIG. 21 may be deployed as an array of smart sensors or agents to collect data that may be sent back to a central processing unit.

Figure 22:
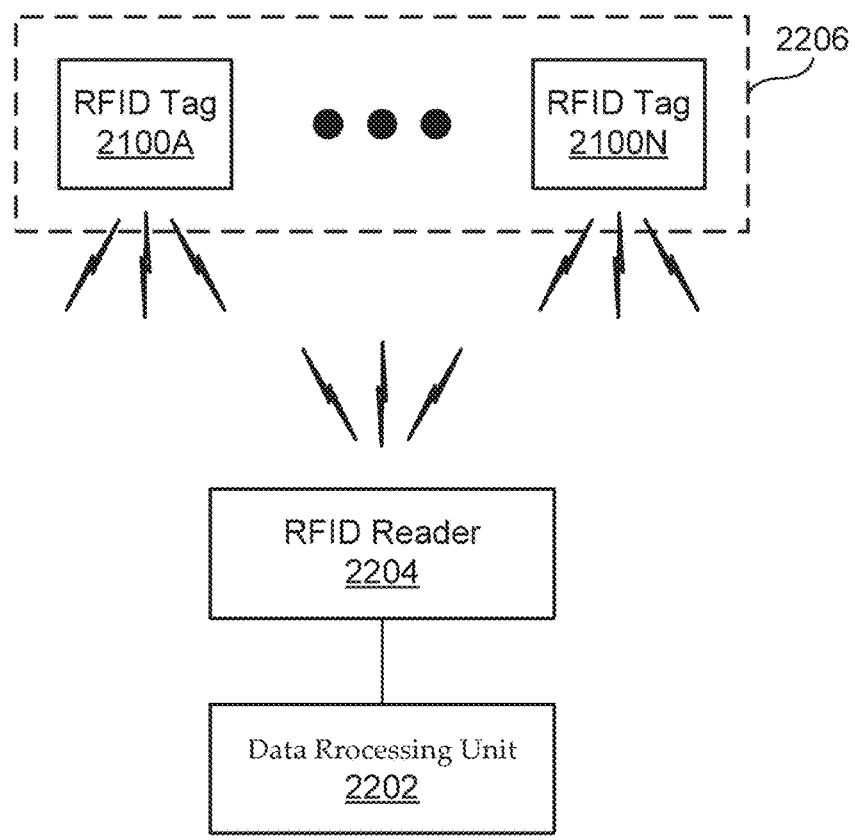
FIG. 22 is a block diagram of one arrangement of smart sensors and a data processing unit 2202 in accordance with embodiments of the present disclosure.

FIG. 22 is a block diagram of one arrangement of smart sensors and a data processing unit 2202 in accordance with embodiments of the present disclosure. Here a series of passive RFID sensors 2100A-N are deployed wherein each sensor may have a unique identification number stored within the memory module and communicated via the internal wireless communications engine 2104 to a data processing unit. Interrogator (RFID reader) 2204 interacts with passive RFID sensors 2100A-N. Interrogator 2204 may then communicate with a data processing unit 2202. Thus the passive RFID sensor array 2206 may allow information to be sensed and communicated via RFID reader 2204, wherein this information may be preprocessed at the passive RFID sensor, or remotely processed at the RFID reader 2204 or data processing unit 2202 depending on the system needs.

Embodiments of the present disclosure realize an advantage over prior systems, in that not all sensing requires high precision sensors which are both expensive and consume relatively large amounts of power. The sensors provided by embodiments of the present disclosure are relative measurements and post processing of collected measurements yields sense information. Calibration may be done during manufacturing at the wafer or die level or when the assembled sensors are deployed in the field wherein this calibration information may be stored in the memory module 2102. This information may be retrieved at any time for baseline calculations. From relative changes accurate information may then be derived from remote data processing provided by data processing unit 2202. Calibration may involve retrieving sensing measurements from memory module 2102 or current measurements directly form sensor engine 2106. The use of this information then allows accurate data associated with environmental conditions to be determined. In one example, RFID sensor array 2206 of FIG. 22 may include temperature sensors. Wherein each passive RFID sensor 2100A-N is an independent sensor and may sense a current condition at time zero that is stored to memory module 2102 or sent to data processing unit 2202. This measurement may be repeated at Time 1. Wherein this data is either stored or transmitted. Data processing unit 2202 may perform more complex calculations. For example, if the temperature is known at Time 0, the sensor information collected at Time 1, when communicated may be processed using information associated with the measurements and known temperature at Time 0 in order to determine or approximate an actual temperature. This may involve a lookup in a characterized data table or computations based on mathematical models of the calibration of the sensors to determine or approximate the actual temperature.

Another embodiment can sense the level of wetness or humidity proximate to the sensor engine. In either case, temperature or moisture, raw data may be collected from passive RFID sensors via the RFID reader for processing to be performed by data processing unit 2202 where the computation to determine a humidity or temperature measurement.

Figure 23A:
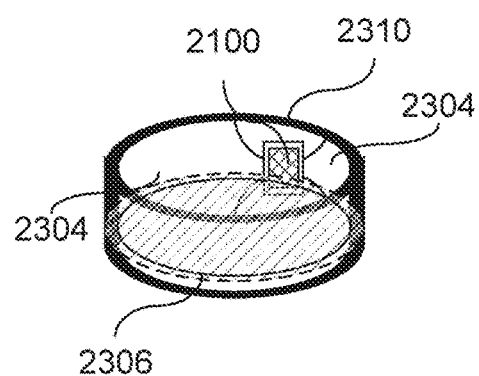
FIGS. 23A and 23B are views of an RFID seal tag with an antenna scaled by an induction seal in accordance with an embodiment of the present disclosure.
Figure 23B:
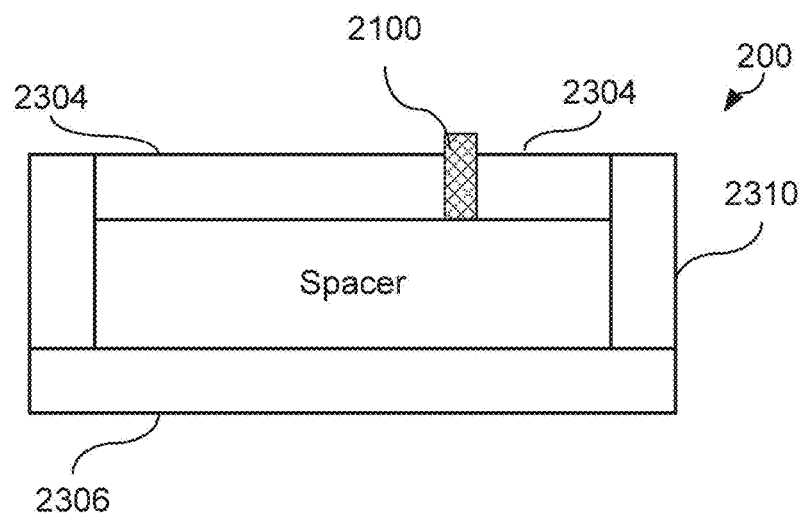

FIGS. 23A and 23B are views of an RFID seal tag with an antenna sealed by an induction seal in accordance with an embodiment of the present disclosure. FIG. 23A provides an isometric depiction of an RFID tag having a seal tag about the perimeter of the antenna. FIG. 23A shows IC 2100 coupled to an antenna 2304. Spacer 2306 may separate antenna 2304 from an induction seal 2308. Perimeter ring 2310 about antenna 2304 may be welded to couple antenna 2304 to induction seal 2306. This is shown isometrically in FIG. 23A, where the antenna 2304 couples to induction seal 2306 creating a larger antenna surface. This embodiment of a passive RFID sensor tag coupled to the induction seal may be placed within a container such as a pill bottle in order to measure temperature and wetness or humidity inside the pill bottle.

Figure 24A:
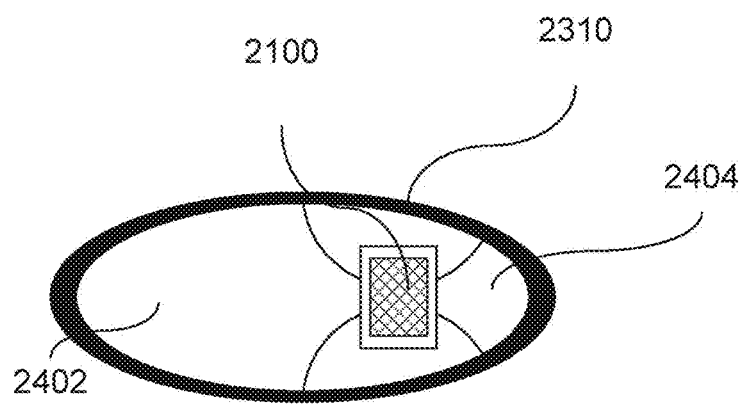
FIGS. 24A and 24B depict different antenna inlays that may be used in accordance with embodiments of the present disclosure.
Figure 24B:
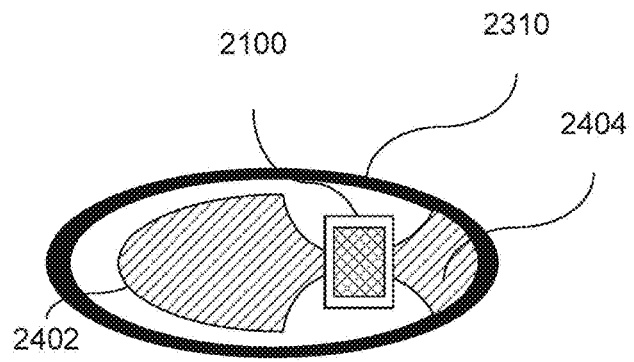

FIGS. 24A and 24B depict different antenna inlays that may be used in accordance with embodiments of the present disclosure. In FIG. 24A the antenna wing 2402 and wing 2404 may both couple to the induction seal 2310. In this case the antenna wings form a loop where the entire edge of the antenna inlay is attached to the induction seal and the induction seal completes the loop coupling wings 2402 and 2404. In the embodiment provided in FIG. 24B, antenna wing 2402 and wing 2404 are not coupled by the induction seal 2310. In FIG. 24B Left wing 2402 and right wing 2404 are separated by I C 2100 wherein left wing 2402 is isolated by a gap from the right wing and the induction seal 2308 serves as the right wing 2404. Performance is sensitive to the thickness of the tape used to attach the passive RFID sensor. Wherein the passive RFID sensor (pill tag) of FIGS. 23A, 23B, 24A, and 24B may involve an antenna being a single layer of copper on captain folded and laminated about a PET core used as a spacer to create a dielectric layer between the antenna and the induction seal. The RFID tag provided by FIGS. 23A, 23B, 24A, and 24B provides an RFID tag that may be attached to a metalized lid insert for use in a pill bottle or other like use.

Figure 25:
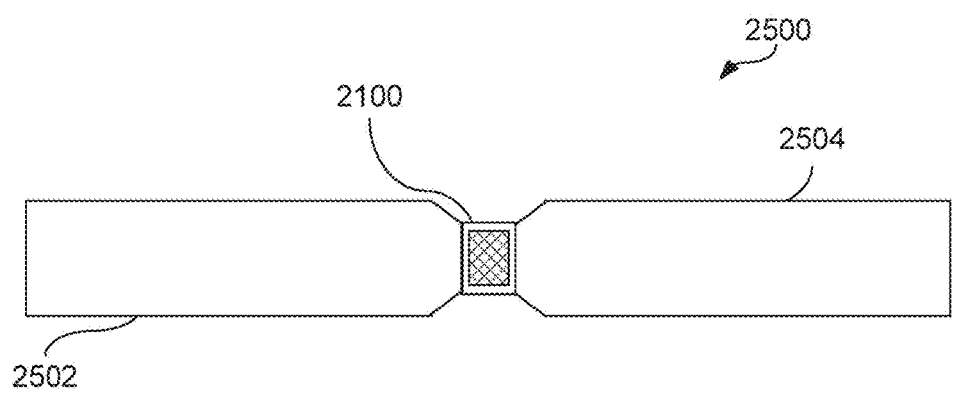
FIG. 25 provides an illustration of an antenna arrangement in accordance with embodiments of the present disclosure.

FIG. 25 provides an illustration of an antenna arrangement in accordance with embodiments of the present disclosure. In this antenna arrangement 2500 the antenna comprises a first antenna wing 2502 and a second antenna wing 2504 coupled to IC 2100 Via connections 2506. IC 2100 may optimize the impedance match between the IC 2100 and antenna 2500. This can be accomplished by adding shunt capacitors, variable inductors or variable impedances across the input terminals of I C 2100. As a result, the input impedance of integrated circuit can be varied between in one embodiment can be varied between 2.4 minus J 67.6 to 0.92 minus J 41.5 ohms. An antenna such as that provided in FIG. 25 may be designed to operate within these impedance values.

In one embodiment this may provide an RF sensitivity of approximately −10.5 DbM. The antenna provided in FIG. 25 may be optimized to provide a conjugate match in one embodiment at about 960 megahertz. This allows the integrated circuit to optimize and match by selecting the best MMS value over the remaining portion of the frequency band. The operational bandwidth is proportional to the tag thickness.

FIG. 26 provides an illustration of an antenna arrangement in accordance with embodiments of the present disclosure. In this antenna arrangement 2600 the antenna comprises a first antenna wing 2602 and a second antenna wing 2604 coupled to IC 2100 Via connections 2606. IC 2100 may optimize the impedance match between the IC 2100 and antenna 2600. First antenna wing 2602 and second antenna wing 2604 can have interdigitated portions 2608, wherein the coupling of these interdigitated portions 2608 varies with dielectric changes in the gap 2610 between the interdigitated portions 2608. This can be accomplished by adding variable impedances across the input terminals of I C 2100.

Figure 27A:
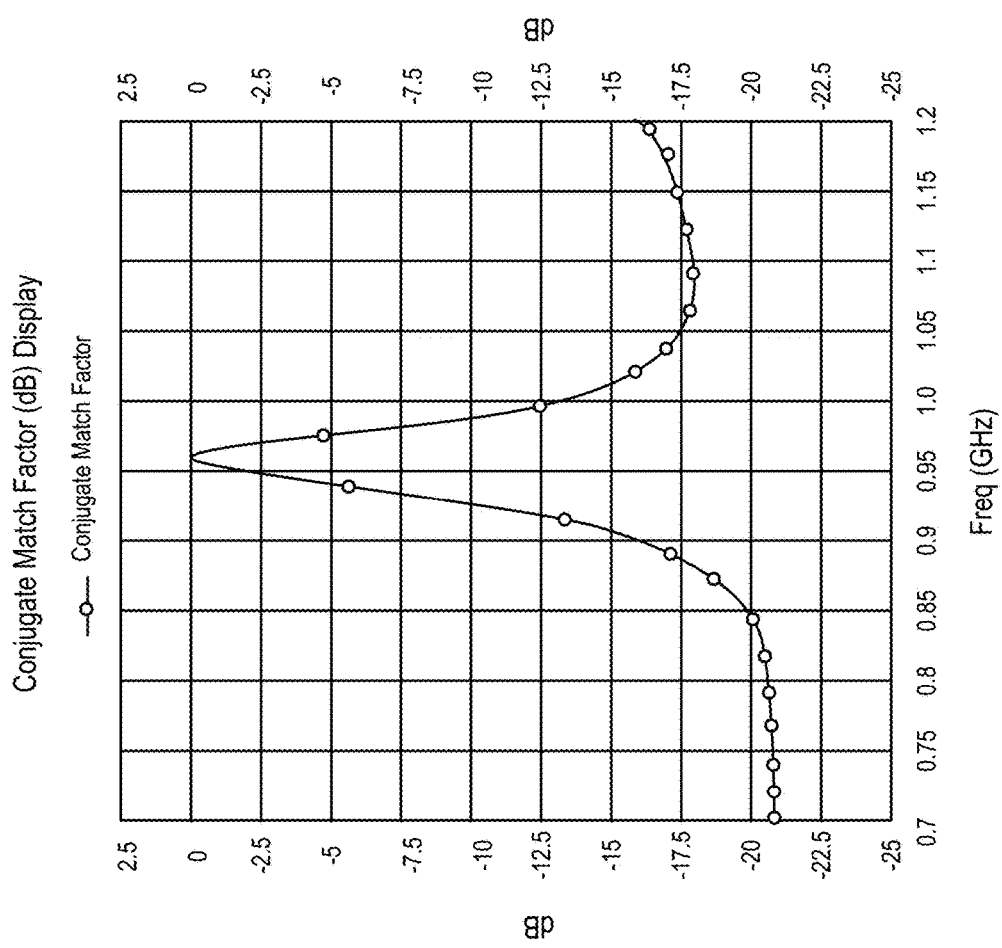
FIGS. 27A and 27B are graphs of the conjugate match factor (CMF) where the passive RFID sensor tags have a thickness of 0.03 and 0.05 inches thick tags with an MMS value of 0 in accordance with another embodiment of the present disclosure.
Figure 27B:
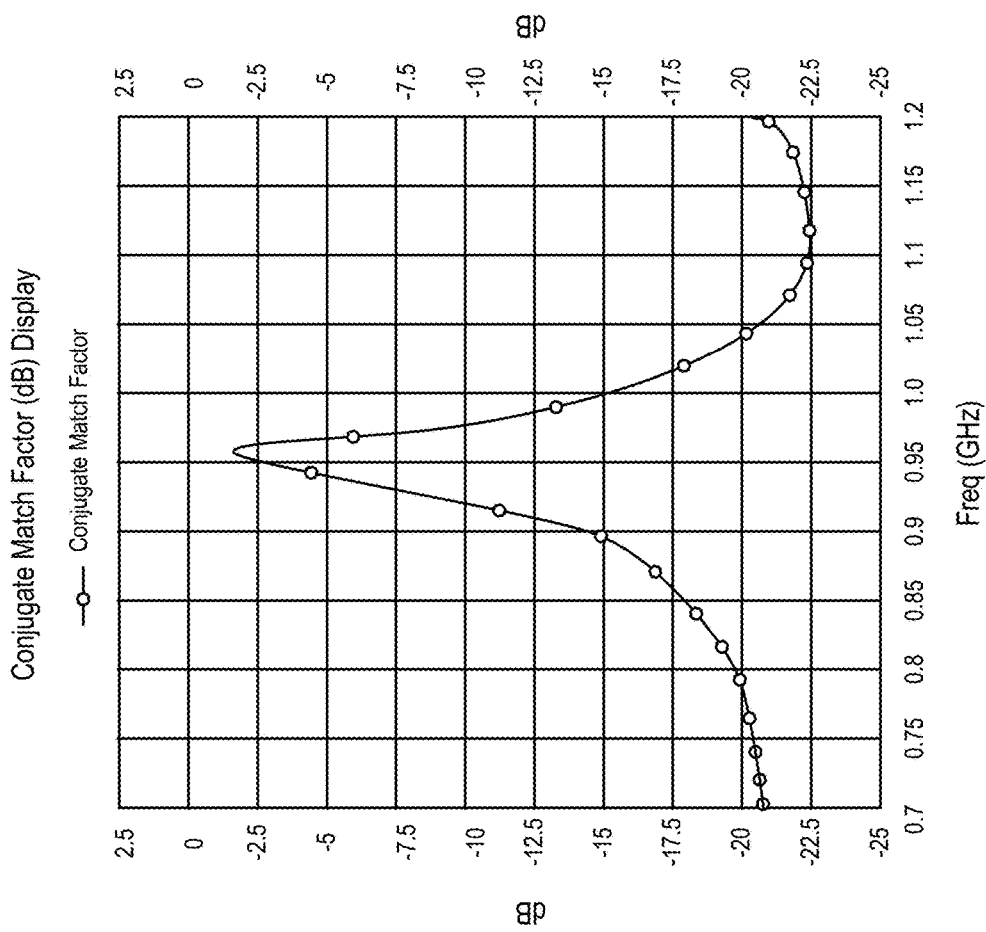
Figure 28A:
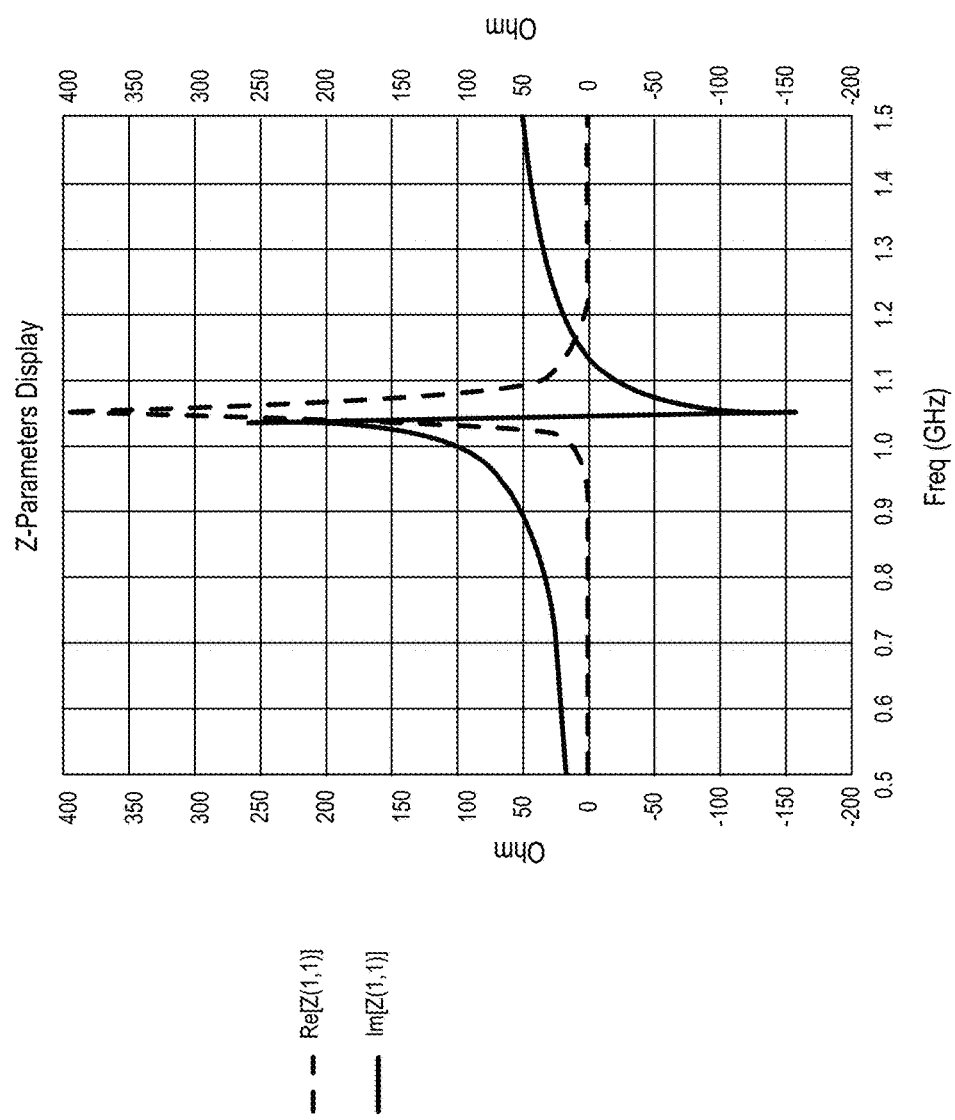
FIGS. 28A and 28B provide graphs of the antenna impedance for the previously depicted antenna of FIG. 25 in accordance with another embodiment of the present disclosure.
Figure 28B:
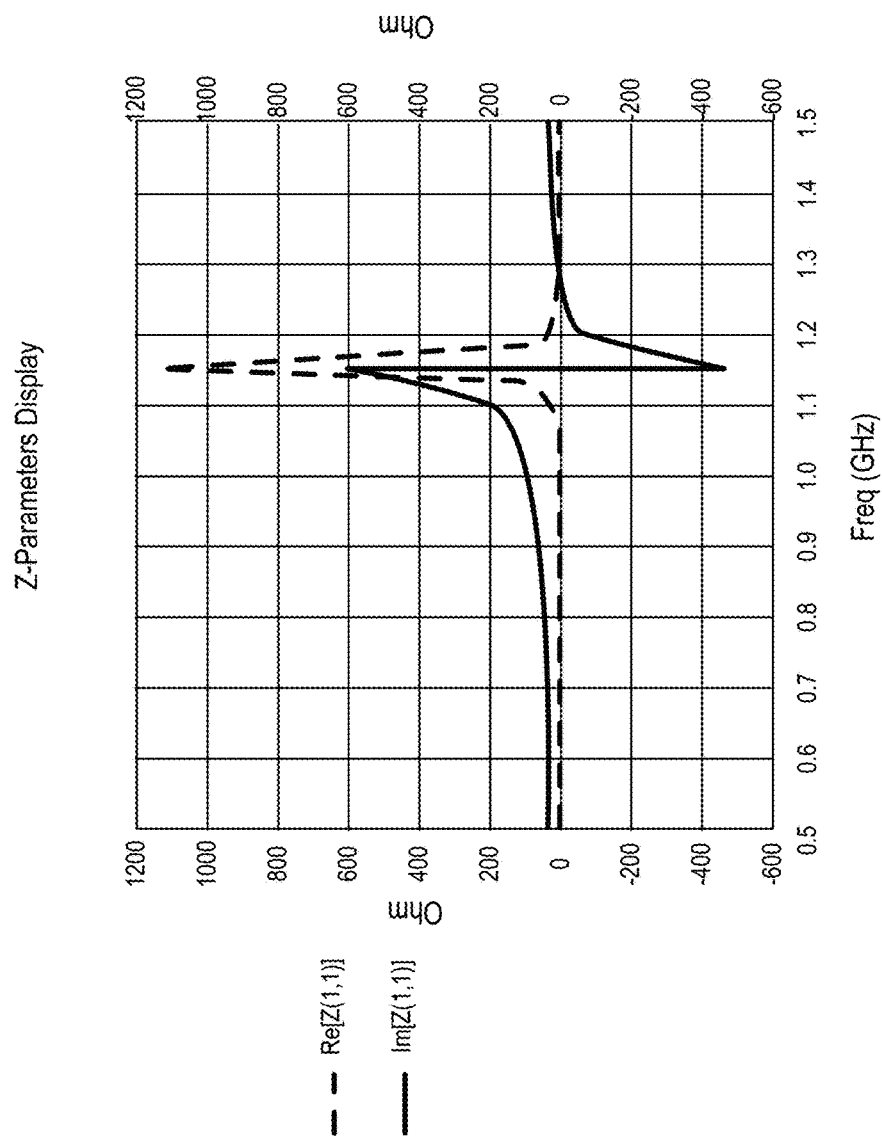
Figure 29A:
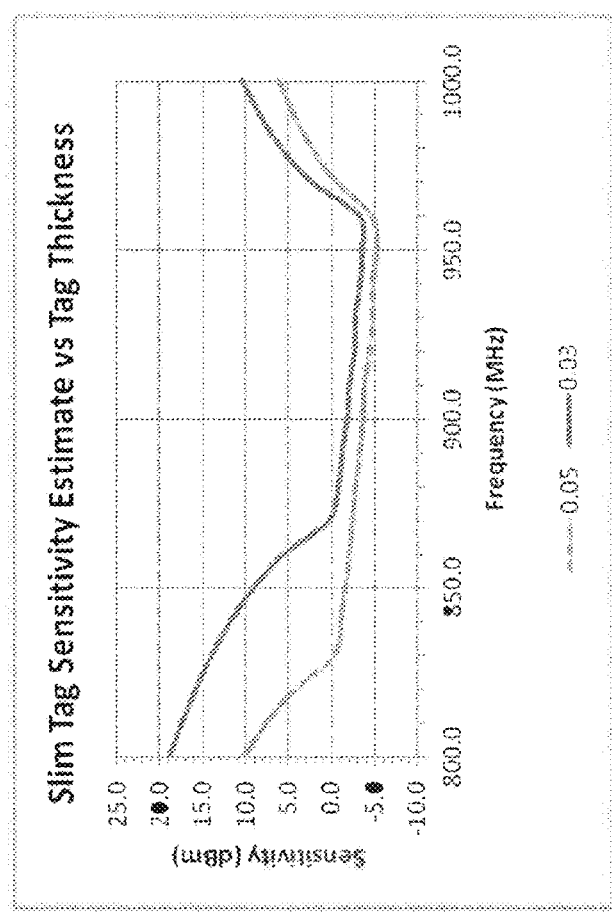
FIGS. 29A and 29B provide sensitivity graphs for varying thicknesses associated with the antenna's impendence, directivity, and radiation efficiency values are used to predict the RF sensitivity and read range of the RFID tag in accordance with embodiments of the present disclosure.
Figure 29B:
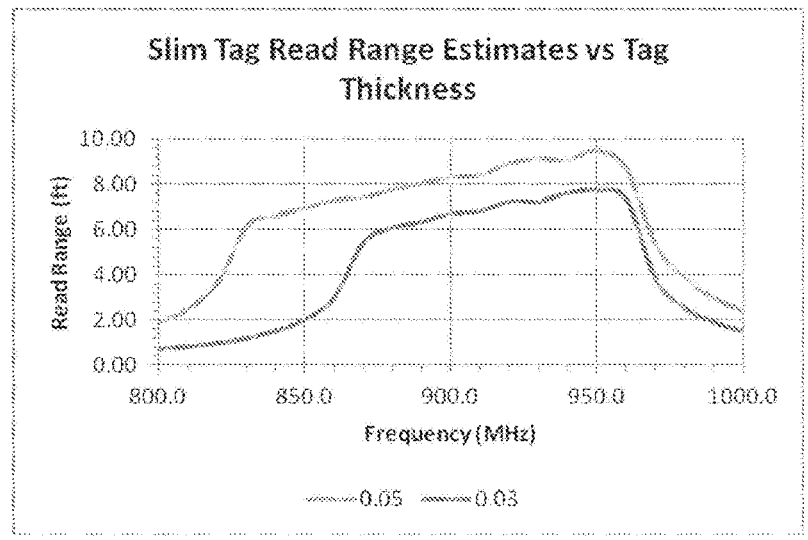

FIGS. 27A and 27B are graphs of the conjugate match factor (CMF) where the passive RFID sensor tags have a thickness of 0.03 and 0.05 inches thick tags with an MMS value of 0. FIGS. 28A and 28B provide a graph of the antenna impedance for the previously depicted antenna of FIG. 25. The rate of change in the impedance data for the thicker version is shown to be less than the rate of change in the impedance for the thinner version. This equates to a larger operation bandwidth. FIGS. 29A and 29B provide sensitivity graphs for varying thicknesses associated with the antenna's impendence, directivity, and radiation efficiency values are used to predict the RF sensitivity and read range of the RFID tag.

The antennas provided by embodiments of the present disclosure may be fabricated in one embodiment using flex PCB materials. Electrical connections between the bumps of the integrated circuit and the antenna allow the antenna and integrated circuit to be electrically coupled.

Figure 30A:
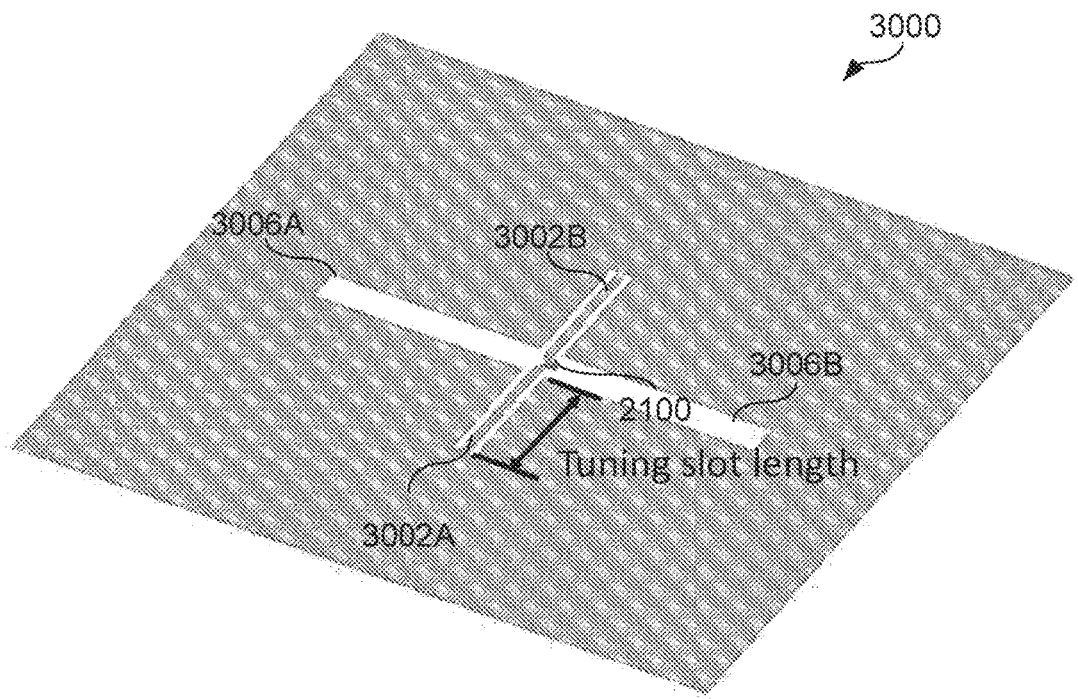
FIGS. 30A and 30B are illustrations of an antenna arrangement in accordance with another embodiment of the present disclosure.
Figure 30B:
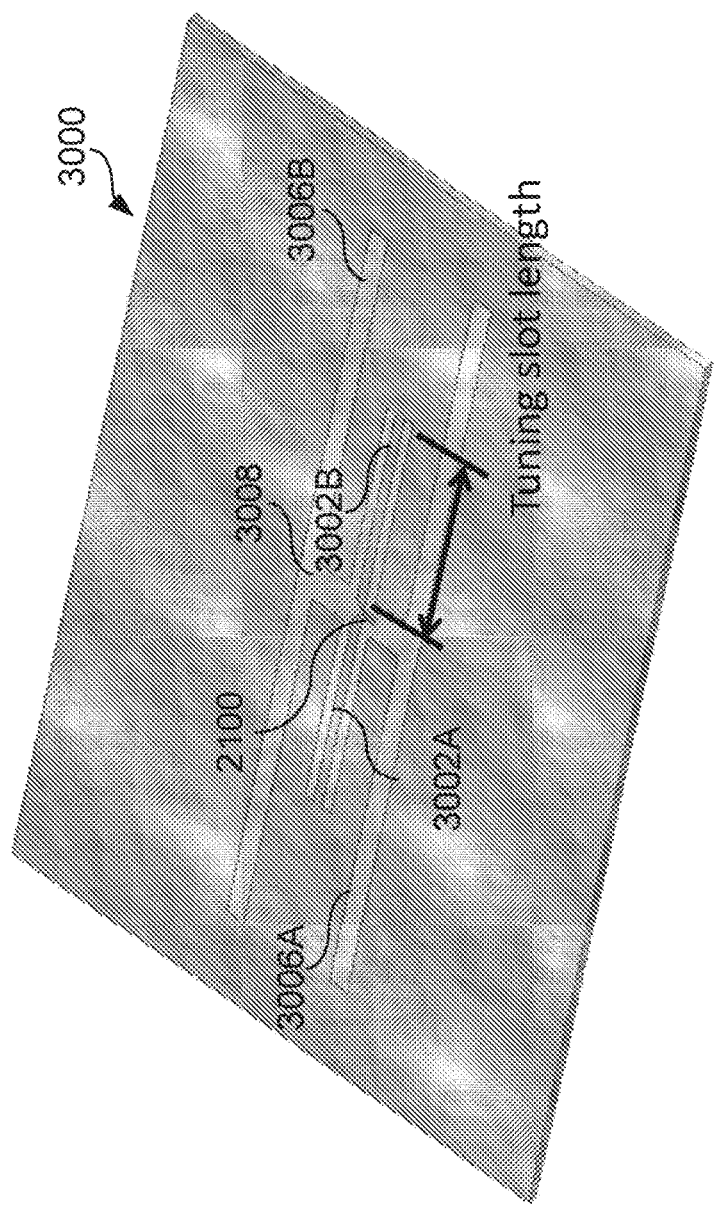

FIG. 30A provides an illustration of an antenna arrangement in accordance with another embodiment of the present disclosure. In this slot tag antenna arrangement 3000, antenna 3000 may comprise one or more tuning slot lengths, 3002A and 3002B. Wherein IC 2100 couples to the antenna via bond pad connections. FIG. 30B depicts a second arrangement of a slot tag design. Wherein the longitudinal slots 3006A and 3006B form an H pattern with lateral slot 3008. This slot tag may comprise a single layer of copper on kapton laminated with transfer tape onto a PET core. This PET core may comprise one or more layers laminated with transfer tape such as the overall thickness of the dielectric layer may be about 40 mil.

FIGS. 31 and 32 are views of an RFID pressure sensing tag 3100 in accordance with an embodiment of the present disclosure. Pressure sensing tag 3100 is a passive RFID tag, which includes a sensor, the sensor having a variable sensor impedance, and IC 2100. The sensor impedance varies. In one embodiment conductive plate 3104 is located proximate to a tuning circuit 3102. When an external pressure is applied to the conductive plate, the separation between conductive plate 3104 and tuning loop 3102 is reduced causing an impedance change. The impedance of the tuning circuit in the processing module coupled to the sensor then produces an output, a sensor code, representative of the pressure applied. This data may be stored within a memory circuit of I C 21 00 or transmitted to an external reader by the wireless communication module of IC 2100.

Conductive plate 3104 may sit on a compressible material space 3106 as shown in the cross section of FIG. 32. The presence and relative movement of conductive plate 3104 reduces the inductance of the tuning loop 3102. This causes the tuning module of IC 2100 to generate different sensor codes to compensate for the impedance change. In one embodiment, compressible material space 3106 has a substantially linear compression between 25 and 50% compression.

Figure 33:
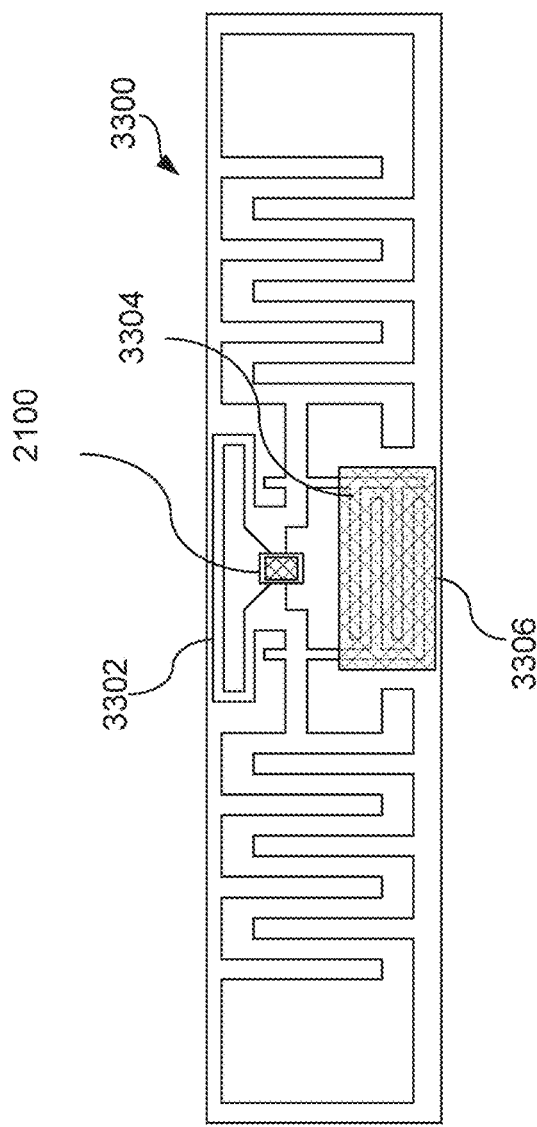
FIG. 33 is a view of an RFID moisture or humidity sensing tag in accordance with an embodiment of the present disclosure.

FIG. 33 is a view of an RFID moisture or humidity sensing tag 3300 in accordance with an embodiment of the present disclosure. Moisture or humidity sensing 3300 is a passive RFID tag, which includes a sensor, the sensor having a variable sensor impedance, and IC 2100. The sensor impedance varies as the coupling of interdigitated capacitor 3304 responds to environmental changes. In one embodiment interdigitated capacitor 3304 is located proximate to a film 3306 applied above interdigitated capacitor 3304. Film 3306 may be a material having an affinity for water (i.e. moisture or humidity) or other fluids. These fluids may include CO, $CO_2$, Arsenic, $H_2S$ or other known toxins or gases of interest. When film 3306 absorbs a fluid such as those described previously, the dielectric constant proximate to the interdigitated capacitor 3304 changes causing an impedance change. The impedance of the interdigitated capacitor 3304 sensed by the processing module coupled to the sensor then produces an output, a sensor code, representative of the absorbed material within film 3306. This data may be stored within a memory circuit of I C 21 00 or transmitted to an external reader by the wireless communication module of IC 2100.

Figure 34B:
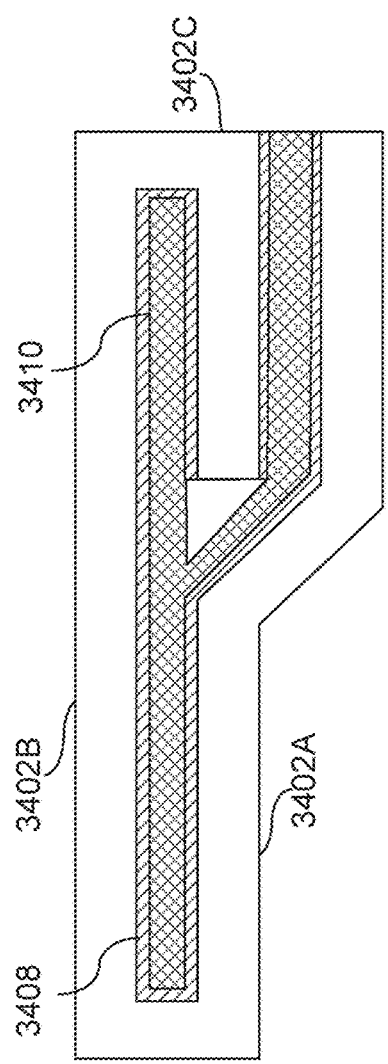

FIGS. 34A and 34B are views of a folded RFID tag 3400, including antenna 3402 comprising a radiating element, the radiating element comprising a first wing 3402A and a second wing, the second wing divided into a proximal section 3402B and a distal section 3402C, the distal section 3402C folded onto the proximal section 3402B, and the first wing 3402A folded onto the folded second wing, the distal section 3402C of the second wing capacitively couples to the proximal section 3402B and the first wing 3402A. These sections are folded about a PCB core.

Figure 35:
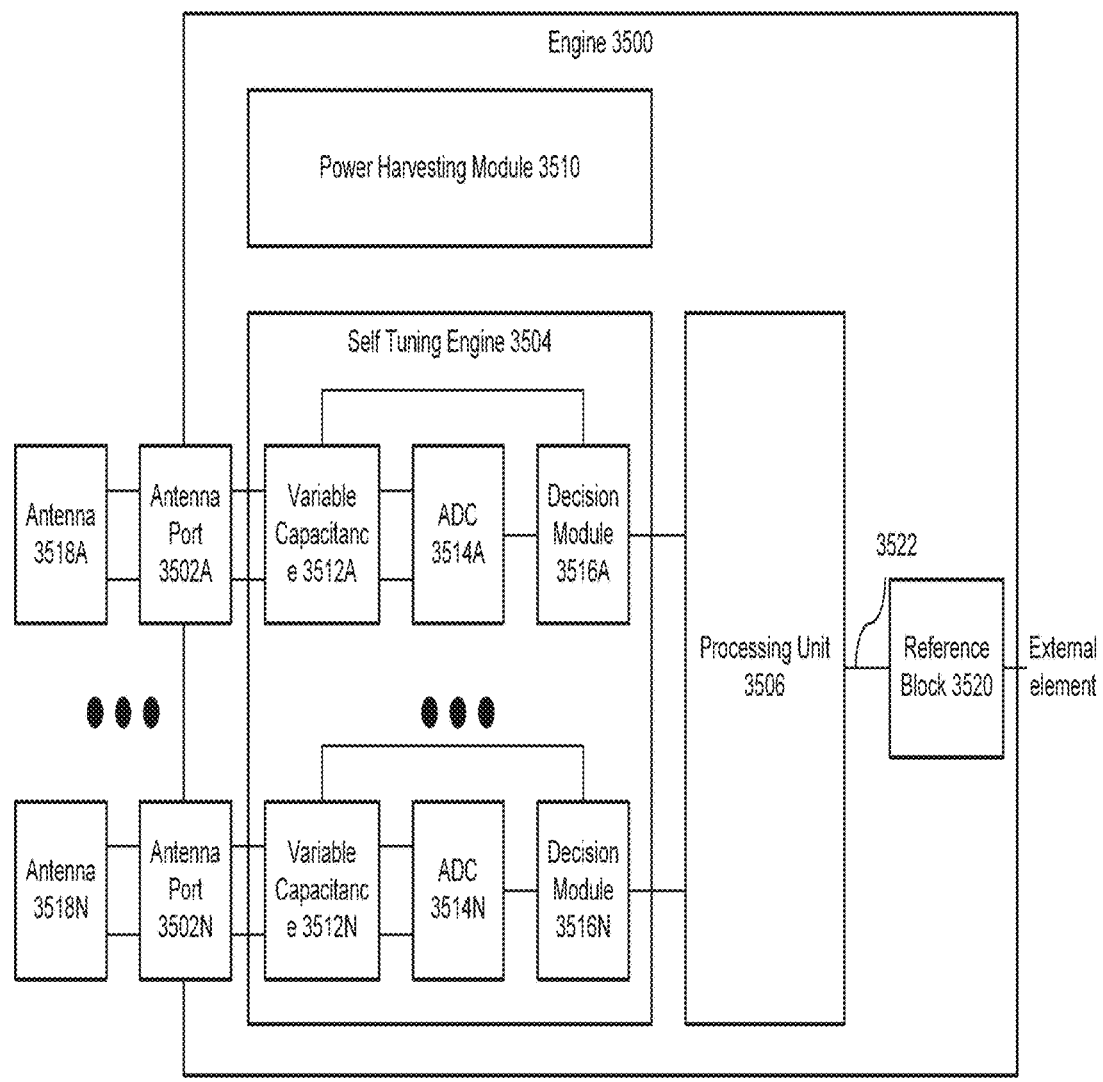
FIG. 35 is a block diagram of one arrangement of a self-tuning engine to support the reporting of several stimuli with multiple passive RFID sensors using an antenna impedance sensing mechanism in accordance with embodiments of the present disclosure.

FIG. 35 is a block diagram of one arrangement of a self-tuning engine to support the reporting of several stimuli with multiple passive RFID sensors using an antenna impedance sensing mechanism in accordance with embodiments of the present disclosure. Module 3500 includes antenna ports 3502A-N, self-tuning engine 3504, processing unit 3506, reference input module 3508 and power harvesting module 3510. A number of antenna ports 3502A-N passively sense stimuli through changing antenna inductance as previously discussed. The self-tuning engine 3504 adjusts a variable capacitance 3512A-N in response to the inductance sensed as ADC 3514A-N wherein decision module 3516A-N directs feedback to adjust the value of variable capacitance 3512A-N and produce a code reported to processing unit 3506. This sensor code reflects the sensed stimuli relative to the antenna inductor 3518A-N. The stimuli sensed may be any combination of stimuli sensed by the changing inductance of the antenna (i.e. pressure, moisture, proximity etc.) Processing unit 3506 is coupled to the self-tuning engine 3504 and other potential reference inputs such as those provided by reference block 3520. Reference block 3520 allows the processing unit to compensate for external elements sensitive to external stimulus with an input to processing unit 3506. One such example may be where an external element is sensitive to a condition such as temperature, in this example reference block 3520 provides a reference signal 3522 for the processing unit 3506. The block as a whole may be powered by a power harvesting engine 3510 to supply on-chip power needs.

Figure 36:
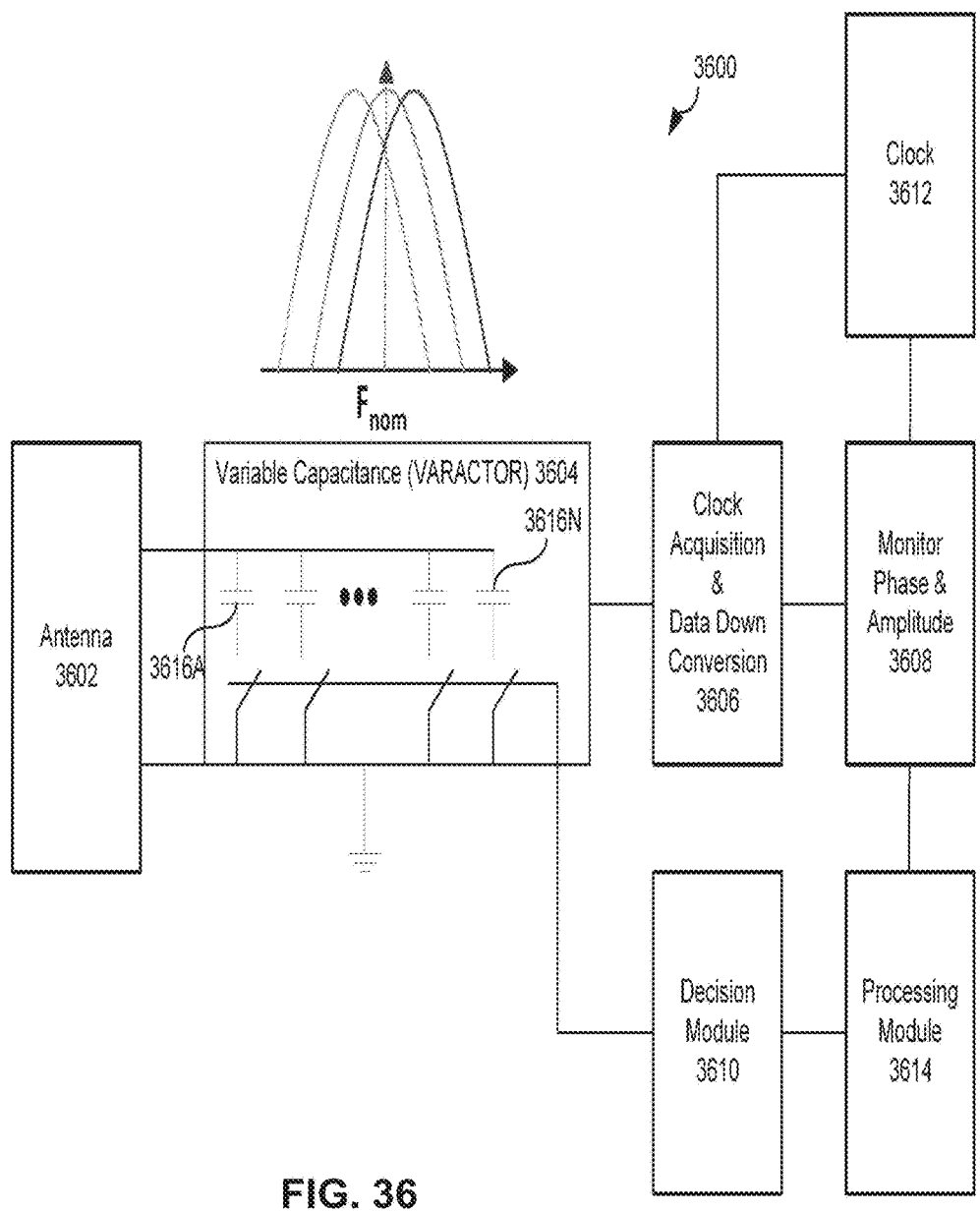
FIG. 36 is a block diagram of a self-tuning engine in accordance with embodiments of the present disclosure.

FIG. 36 is a block diagram of a self-tuning engine in accordance with embodiments of the present disclosure. Self-tuning engine 3600 includes an antenna 3602, a variable capacitance or varactor module 3604, a clock acquisition and data conversion module 3606, a monitoring module 3608, a decision module 3610, processing module 3614, and a clock module 3612.

Varactors are basically voltage-controlled capacitors. Varactors are implemented in various forms, for example as discrete components, in integrated circuits, in MEMS (microelectro-mechanical systems). Varactors are widely used in RF circuits as tuning elements. Examples of two MOS varactors can be seen in FIGS. 37A and 37B their capacitance vs. voltage plots (CV curve) in FIGS. 38A and 38B.

Figure 38A:
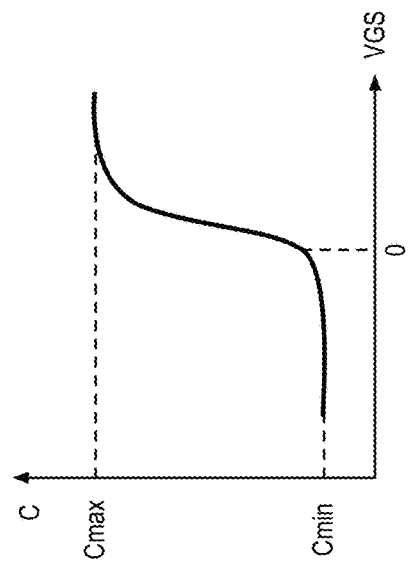
FIGS. 38A and 38B are representations of the CV curve behavior of the MOS Varactors in FIGS. 37A and 37B respectively.
Figure 37A:
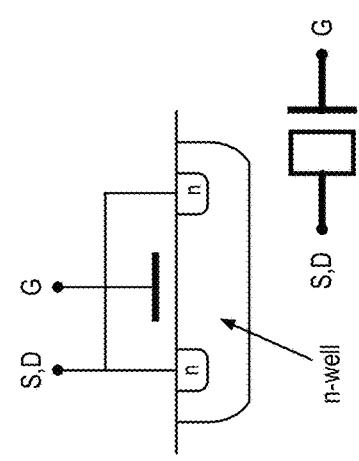
FIGS. 37A and 37B are representations of MOS Varactors utilized by embodiments of the present disclosure.
Figure 37B:
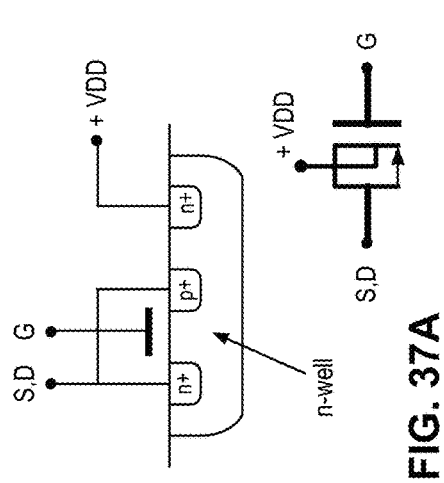

FIGS. 37A and 37B are representations of MOS Varactors, where FIG. 37A illustrates an inversion MOS varactor, and FIG. 37B illustrates an accumulation MOS varactor. The varactor shown in FIG. 37A is an inversion type MOS varactor and is built by connecting bulk of the transistor to the highest positive voltage available in the circuit and by connecting drain and source terminals to each other. Thus, transistor does not enter accumulation region, and capacitance is determined by gate and S/D (Source/Drain) terminals. This inversion MOS varactor exhibits steep CV curve behavior as shown in FIG. 38A.

Figure 38B:
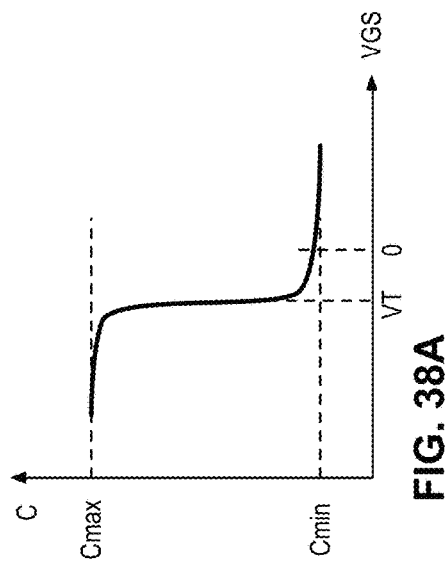

The varactor shown in FIG. 37B is an accumulation type MOS varactor. This varactor is similar to a NMOS transistor with the drain (D) and source (S) terminals are connected to each other. The bulk of the transistor is n-type not a p-type and is not connected to a higher voltage as was the case for an inversion type MOS varactor. By increasing the gate voltage applied, more electrons are attracted to the gate, so capacitor value increases. This accumulation type MOS varactor exhibits the CV curve behavior as shown in FIG. 38B.

For a specific process, the maximum and minimum capacitance values achieved are same for an inversion and accumulation type varactors. As the mobility of electrons are higher than hole mobility and CV curve of an accumulation type varactor is smoother, accumulation type MOS varactors are often preferred. Quality factors of MOS varactors are usually in the range of 50 to 80 at 1 GHz and tuning ranges are 40 to 60%.

Figure 39:
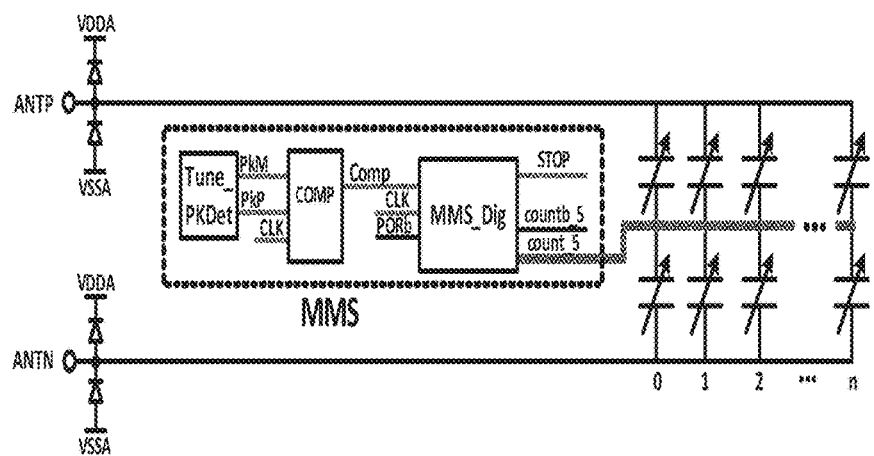
FIG. 39 illustrates an embodiment of the self-tuning engine provided by embodiments of the present disclosure along with the varactors that are driven by the tuning circuitry (referred to as MMS engine)

FIG. 39 illustrates an embodiment of the self-tuning engine provided by embodiments of the present disclosure along with the varactors that are driven by the tuning circuitry (referred to as MMS engine). The varactors in this embodiment are enhancement MOS varactors. In one embodiment, the engine generates 5 bits of sensor code (also referred to as MMS code) that are then converted to 16 bits (i.e. n=16) of thermometer codes. Each bit of the thermometer code drives one varactor unit. In this embodiment there are a total of 16 varactor units (each unit is a varactor on its own). Each code can be either VDDA (a high voltage) or VSSA (a low voltage signal). The antenna ports; ANTP and ANTN, are set at a voltage value of VDDA/2.0 under normal operation. Looking at this from the varactor perspective, the Gate of each of the 16 varactor units will always be at VDDA/2.0V with respect to Bulk, while the S/D, (Source/Drain), connection of each of the 16 varactor units will be set to VDDA or 0V with respect to Bulk, depending on the sensor code generated. Hence, each of the 16 varactor units will be set to either its min capacitance or max capacitance value. The total capacitance of the varactor structure is the sum of these min/max values. This implementation is referred to here as a digital implementation of an embodiment of the self-tuning engine provided by embodiments of the present disclosure.

Figure 40:
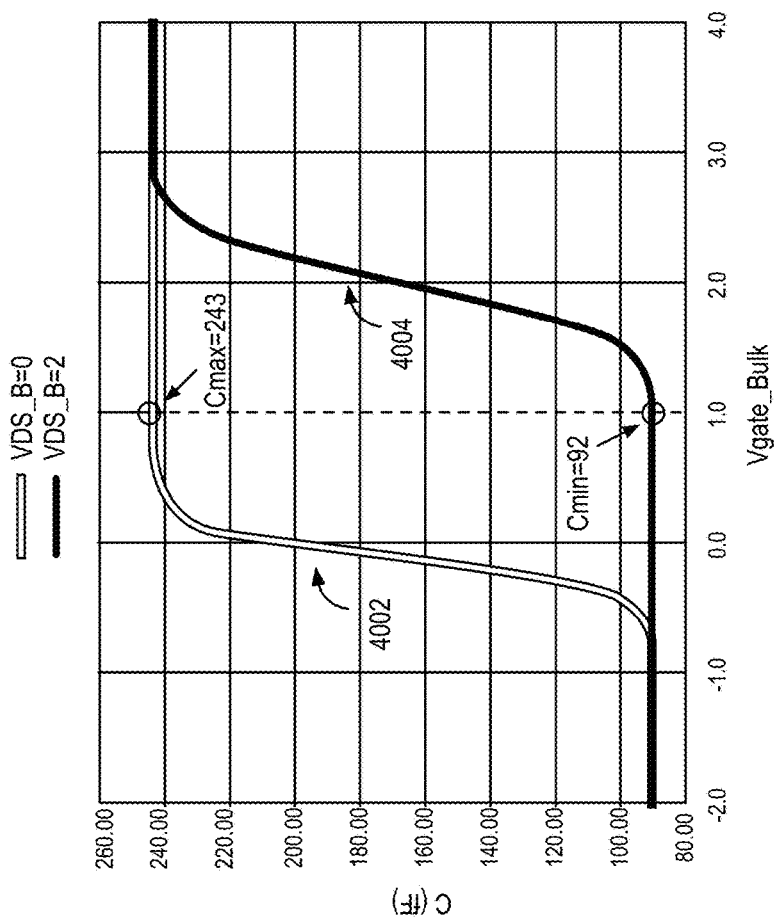
FIG. 40 is a graph of a Varactor's CV curves for different VSD voltages provided by embodiments of the present disclosure.

FIG. 40 is a Varactor's CV curves for different $V_{SD}$ voltages. In one embodiment, FIG. 40 shows the varactor's CV curves for different S/D voltages; 0V (4002) and 2V (4004). For each curve, the gate voltage with respect to Bulk is swept from −2V to +4V and for each sweep, the capacitance of the varactor is plotted.

Under normal operation, the Gate is always sitting at 1V, hence the black and dotted line in FIG. 40. When the S/D is set to 0V, the red curve is used and the varactor's capacitance is equal to Cmax=243 fF. When the S/D is set to 2V, the blue curve is used and the varactor's capacitance is Cmin=93 fF.

Figure 41:
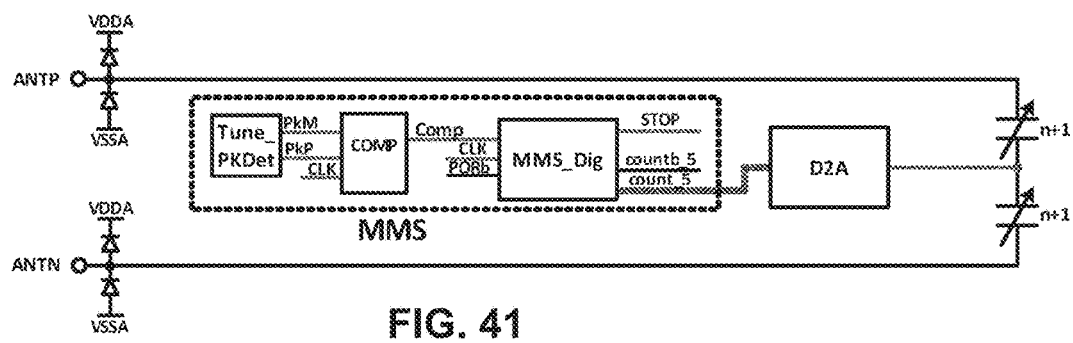
FIG. 41 illustrates another embodiment of the self-tuning engine provided by embodiments of the present disclosure along with the varactors that are driven by the tuning circuitry.

Another embodiment is shown in FIG. 41. In this embodiment, the 16 units of varactors from the embodiment of FIG. 39 are replaced with one unit that has the size of 16 units. The varactor in this embodiment is an enhancement MOS varactor. A digital to analog converter (DAC or D2A) is used to convert the output of the self-tuning engine to an analog signal that drives the source/drain (S/D) connection of this new unit. Either the 5-bit sensor code or its 16-bit thermometer code equivalent can be used to generate the analog signal. DACs are well known circuits in the art and there are many suitable DAC circuits that can be used for this purpose. This implementation is referred to here as the Analog implementation.

Figure 42:
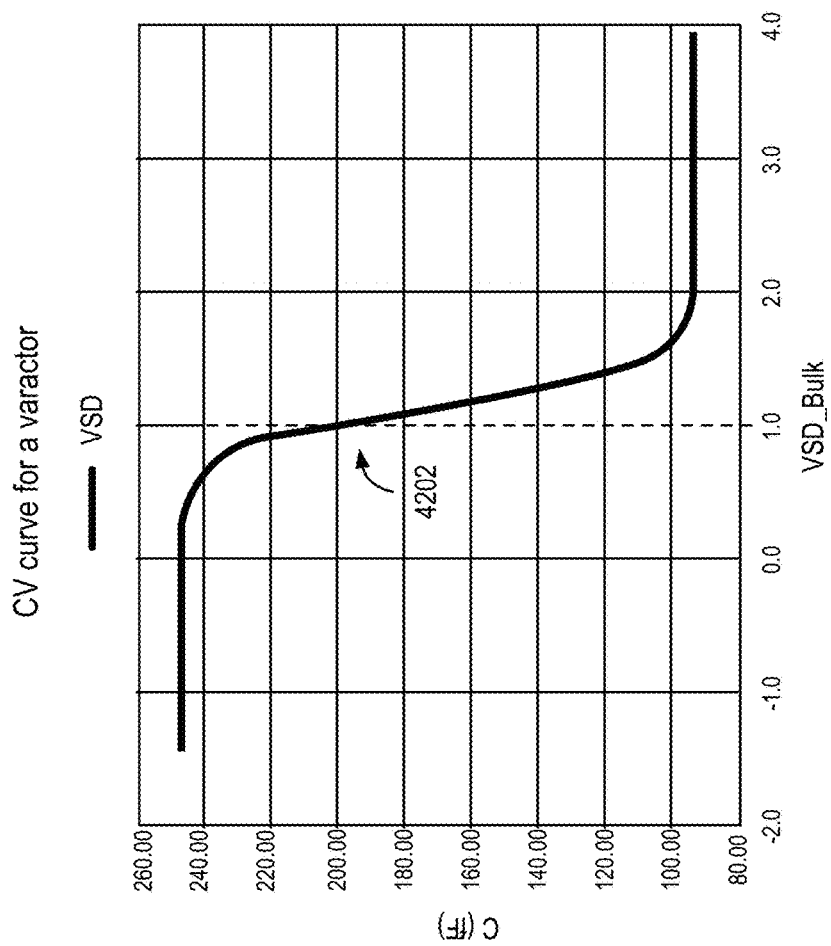
FIG. 42 is a graph of a CV curve for the varactor when S/D voltages are swept in accordance with embodiments of the present disclosure.

FIG. 42 is a graph of a CV curve for the varactor when S/D voltages are swept in accordance with embodiments of the present disclosure. FIG. 42 shows the new CV curve 4202 for the varactor when the source/drain (S/D) voltage is swept. Notice that it has a negative slope. As can be seen from FIG. 42, rather than having 16 discrete steps of varactor values (as with the digital implementation in FIG. 40), the analog control voltage provides a continuum of capacitance values. The design provides more flexibility that the digital implementation. The same structure can be used in various implementations with different resolutions of sensor code and/or DAC. Some of the advantages of the analog implementation are ease of implementation and layout of the varactor, savings in area and routing complexity and modularity of the design.

Embodiments of the present disclosure include RFID sensors with dynamic tuning circuits that are capable of varying the value of a variable capacitor in order to match the impedance of a variable impedance antenna. The capacitor value can be varied in several ways, in particular a digital implementation and analog implementation. The analog implementation utilizes the sensor code from the tuning circuit and converts that sensor code, via a digital to analog converter, into an analog signal that is used to vary the voltage on the gate of, for example an MOS varactor.

Returning to FIG. 36, the clock acquisition and data conversion module 3606 will sense a voltage associated with the variable capacitance or varactor 3604 that may change as a function of antennae impedance wherein the impedance is changed based on environmental stimulus or other like conditions. Monitoring module 3608 may monitor phase and amplitude or other qualities associated with the data collected by clock and data conversion module 3606. This information is then provided to processing module 3614 which in conjunction with decision module 3610 may place capacitors 3616 A through N in service within the variable capacitance or varactor 3604 in order to maximize power transfer or other like considerations with antennae 3602. The manipulation of the varactor 3604 will relate to a sensor code as discussed previously or other like signal. Clock 3612 provides a clock input to the various modules within Engine 3600 such that the data acquisition and the actions of the various processing modules may be coordinated.

Figure 43:
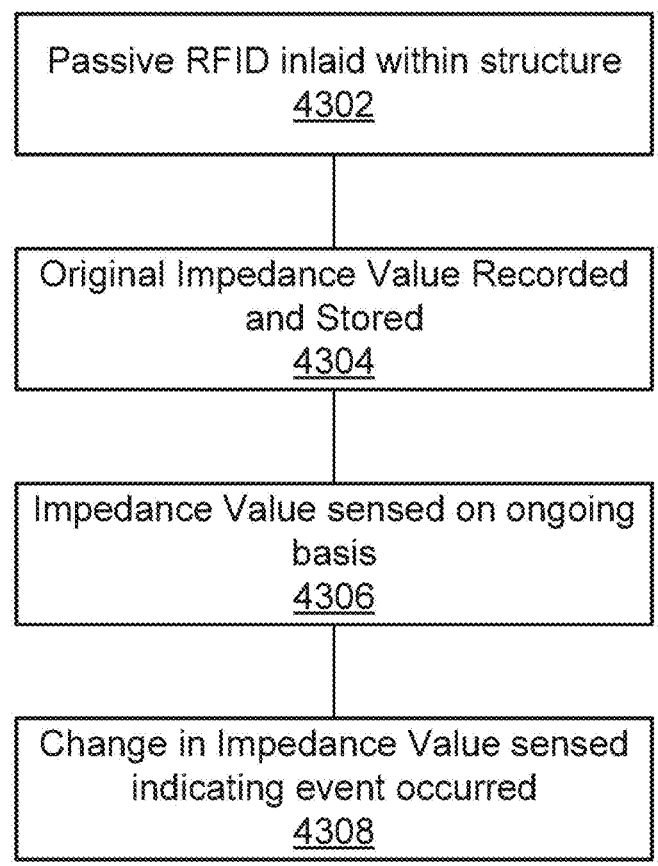
FIG. 43 provides a flow chart of one embodiment of the present disclosure.

Embodiments of the present disclosure may provide a passive RFID sensor (IC chip, antenna, and package) such that once an event of interest has occurred, the structure of the antenna and package may change its characteristics in an irreversible manner. FIG. 43 provides a flow chart of one such embodiment. In Block 4302, a passive RFID sensor, such as an antenna may be inlaid within the structure wherein the antenna may alter a physical characteristic such as impedance when exposed to a sudden force. For example, an antenna may be wrapped around a glass or other structure. The original impedance value may be recorded and stored for comparison in block 4304. In block 4306, the impedance value may be read on an ongoing basis wherein when the impedance value or a code associated with the impedance value changes, that change signals that the event of interest may have occurred. Such an event may be when an object on which the passive sensor is mounted has been dropped.

Figure 44:
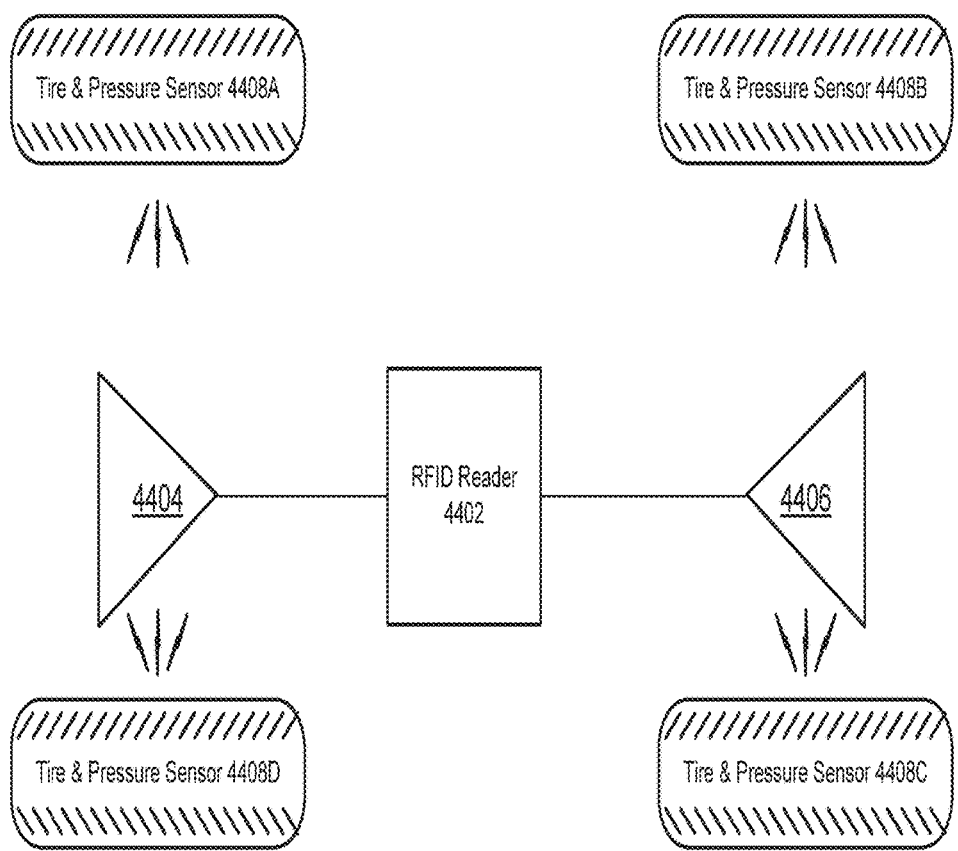
FIG. 44 is a block diagram of an embodiments of the present disclosure that provides a passive tire pressure monitoring system.

Embodiments of the present disclosure may also provide a passive tire pressure monitoring system wherein tire pressure or pressure in any space may be sensed without the need for a local on-board battery. Further the need for complicated circuitries to sense acceleration may be avoided. A RFID reader such as that discussed with reference to the prior FIGs. may automatically find and determine the location of each tire by a strength difference associated with the signal. FIG. 44 depicts one such embodiment wherein four unique tire pressure monitoring sensors are individually located wherein the RFID Reader 4402 may have one or more Antennas 4404 and 4406 wherein signal strength differences between signals read from individual passive tire pressure monitoring sensors 4408A-D allow the RFID reader to determine which passive sensor is associated with which tire. As shown in FIG. 44, each tire is located at a different difference from the antennas 4404 and 4406. Although amplitude may be used to determine tire position, other signal properties may be used as well.

Figure 45:
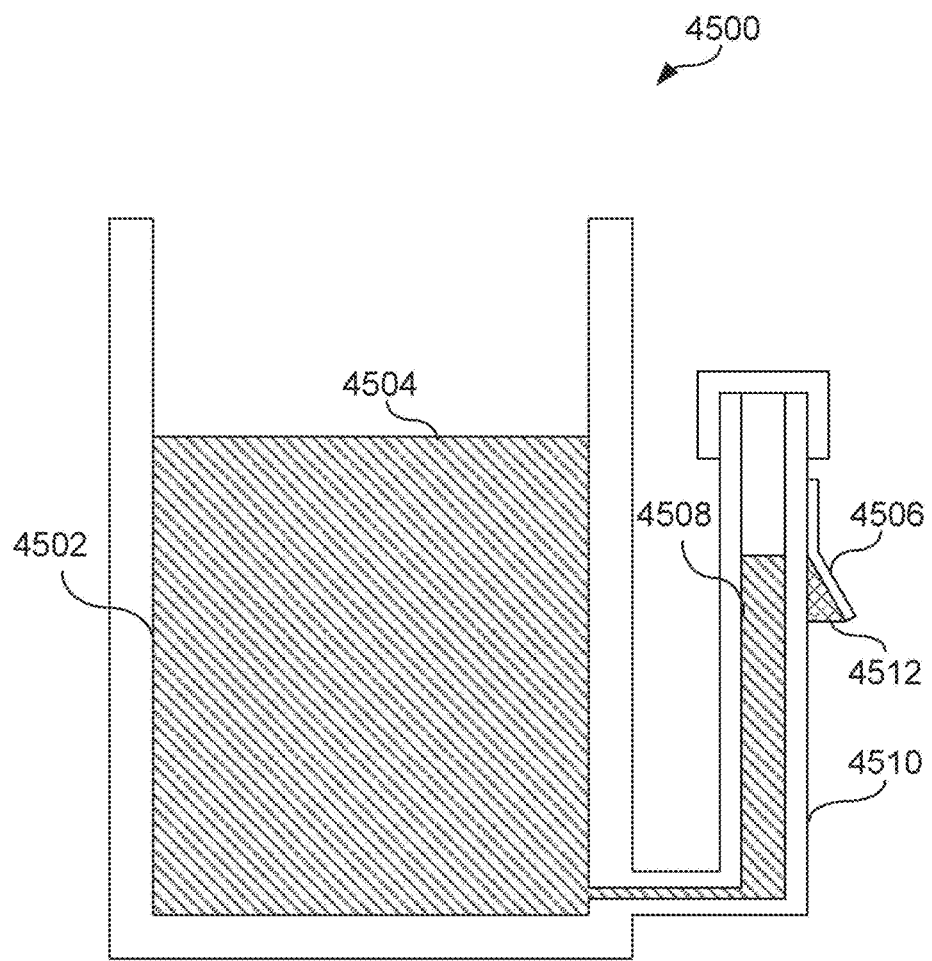
FIG. 45 is a block diagram of a moisture sensor used to monitor the level within a reservoir or tank in accordance with embodiments of the present disclosure.

FIG. 45 is a block diagram of a moisture sensor used to monitor the level within a reservoir or tank. Reservoir 4500 may be a wash tub associated with a dishwasher or washing machine, wherein the primary reservoir 4500 is filled with a fluid 4502 having a level 4504 within the reservoir. Level 4504 is measured using a passive RFID sensor 4506 inductively coupled to the fluid 4508. FIG. 45 shows reservoir 4500 having a sensor tube 4510 communicatively coupled to the reservoir wherein a passive RFID Sensor 4506 is placed on the outer surface of the sensor tube 4510. Sensor tube 4510 may be capped although in other embodiments sensor tube 4510 may run the entire height of reservoir 4500. Capping sensor tube 4510 substantially prevents the tube from completing filling with fluid. On an external surface of sensor tube 4510 a tapered spacer 4512 may be placed between sensor tube 4510 and passive RFID Sensor 4506. This spacer decreases in width as sensor tube 4510 height increases. This makes the passive RFID sensor 4506 more sensitive as the fluid level rises with improved inductive coupling between the fluids contained within the sensor tube and the passive RFID sensor tag.

Figure 46:
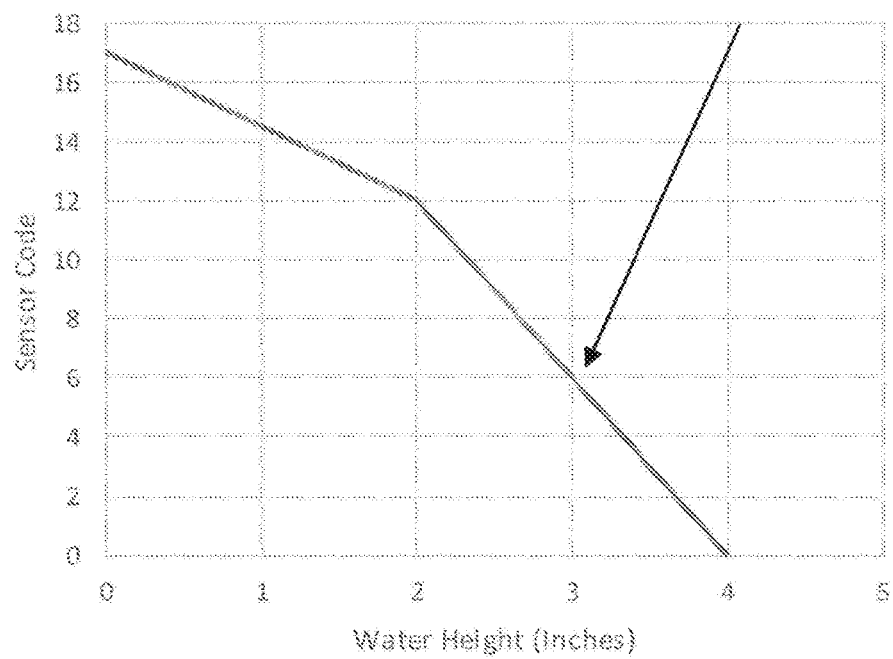
FIG. 46 provides experiment results that illustrate the relation between fluid height and a sensor code generated by a sensor on a single sensor tube as provided in FIG. 45.

The fluid height in the reservoir in FIG. 45 is proportional to the fluid height in the center tube. The height may differ especially when the sensor tube 4510 is capped. This proportionality depends on the compressible air volume in the sensor tube and, the atmospheric pressure to which the reservoir is exposed and the height of the fluid within the reservoir. Experiments depicted in FIG. 46 illustrate the relation between fluid height and a sensor code generated by a sensor on a single sensor tube in FIG. 45.

Figure 47:
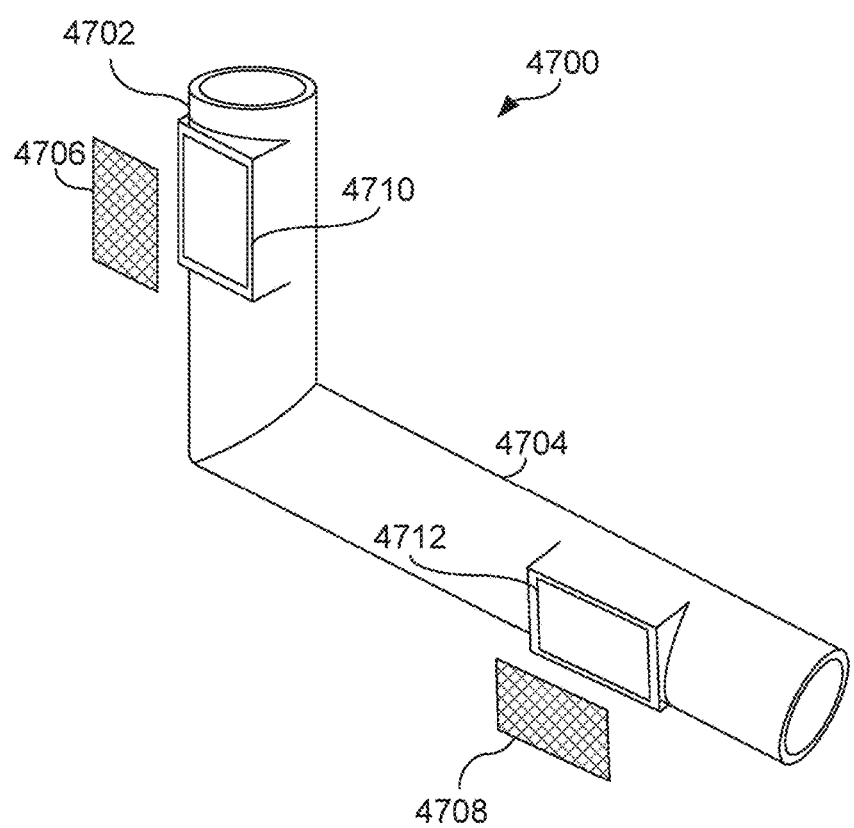
FIG. 47 depicts a second embodiment of a sensor tube in accordance with embodiments of the present disclosure.
Figure 48:
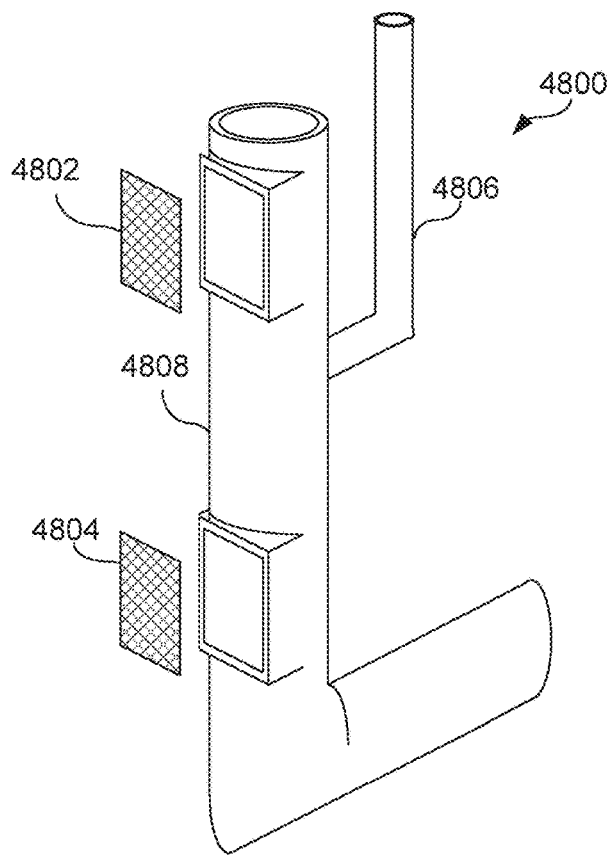
FIG. 48 provides an alternate embodiment of a sensor tube having more than one sensor tag in accordance with embodiments of the present disclosure.

FIG. 47 depicts a second embodiment of a sensor tube such as that disclosed in FIG. 45 wherein sensor tube 4700 contains both a vertical segment 4702 of the tube and a horizontal segment 4 704 of the tube wherein sensor tags 4 706 and 4 708 are located within protective enclosures, 4 710 and 4 712 on the vertical and horizontal segments of Sensor Tube 4700. This two-sensor system allows the horizontal tag to become quickly coupled to fluid within the horizontal segment of the sensor tube as the reservoir begins to fill. The vertical tag is coupled more slowly as the reservoir fills. This will allow the empty reservoir to be readily sensed by both the vertical and horizontal sensor tags. The vertical tag again couples more slowly and will do so after a positive report from the horizontal tag. Variance in the inductance of the horizontal tag may be used as a reference to account for changes in conductance of the fluid of the sensor tube caused such as detergents or other dissolved substances within the fluid. FIG. 48 provides an alternate embodiment of a sensor tube having more than one sensor tag. In this embodiment Sensor Tube 4800 has two vertical sensor tags 4802 and 4804 a secondary tube 4806 that runs the full height of the reservoir and may be open to air. The primary sensor tube 4808 is sealed having an air chamber. The secondary tube 4802 couples to the primary tube below the height of the upper vertical sensor tag 4802. The lower vertical sensor tag 4804 when submerged may provide a signal that allows a more accurate reading of the height by accounting for changes in conductivity within the fluid of the sensor tube 4808.

Embodiments of the present disclosure provide a passive radio frequency identification (RFID) sensor. This passive RFID sensor includes an antenna, a processing module, and a wireless communication module. The antenna has an antenna impedance that may vary with an environment in which the antenna is placed. The processing module couples to the antenna and has a tuning module that may vary a reactive component impedance coupled to the antenna in order to change a system impedance. The system impedance including both the antenna impedance and the reactive component impedance. The tuning module then produces an impedance value representative of the reactive component impedance. A memory module may store the impedance value which may then later be communicated to an RFID reader via the wireless communication module. The RFID reader may then exchange the impedance value representative of the reactive components of impedance with the RFID reader such that the RFID reader or another external processing unit may process the impedance value in order to determine environmental conditions at the antenna. These environmental conditions may include but are not limited to temperature, humidity, wetness, or proximity of the RFID reader to the passive RFID sensor.

In another embodiment, a conductor or transmission line couples the antenna to the processing module allowing the antenna to be positioned remotely or offset from the processing module. In yet another embodiment, a sensor having the sensor impedance that varies with the environment may be coupled to the processing module wherein the sensor impedance may be sensed via a sensor tuning module in much the same way that the antenna impedance is sensed and since a reactive component impedance is determined and a value representative of the impedance is produced which may again be transmitted to an RFID reader for external processing.

In one embodiment, the sensor is offset from the processing module via a conductor or transmission line. In one particular embodiment the sensor is positioned within a cavity offset from the processing module wherein the cavity is impervious to radio frequency signals. This sensor may be an open circuited transmission line where the open circuited transmission line only introduces a capacitance when liquids are present proximate to the open circuit transmission line. The capacitance changes in such an example may change with the volume of liquid proximate to the open circuited transmission line. This is extremely useful when placing liquid or water sensors within cavities such as those contained within a vehicle chassis or when the cavities are prone to fluid incursion. This allows the sensor to be offset from the processing module where the environment to be sensed is hostile to the processing module.

In another embodiment, the sensor may be an interdigitated capacitor wherein the capacitor's impedance changes in response to moisture, i.e. humidity proximate to the interdigitated capacitor. In yet another embodiment, the sensor may be a conductive plate proximate to a tuning fork wherein the conductive plate is separated from the tuning fork by a compressible insulating material wherein an external pressure applied to the conductive plate changes an impedance or inductance of the tuning circuit. In the case of the interdigitated capacitor, the impedance may change in response to an environmental dialectic constant change in the environment proximate to the interdigitated capacitor. This may occur when different gasses or fluids proximate to the sensor involve a change in dielectric constant at the sensor as may be caused by changing gas. Thus in one embodiment the passive RFID sensor may be used to detect an environment toxin such as CO, CO2, arsenic, hydrogen sulfide or other hazardous chemicals.

The passive RFID sensor may also include an RFID power harvesting module operable to receive energy form the RFID reader and power the passive RFID sensor with the received power. The processing module may determine how much of this energy is to be consumed by the passive RFID sensor and divert any remaining energy to a reservoir power harvesting element. Additionally, the memory module may store identification information for the passive RFID sensor wherein the identification information may be provided with the impedance values associated with the antenna or a separate sensor and be provided to the RFID sensor for further processing. Additionally, a time stamp may be applied to this information. This may allow the RFID reader to generate an alarm signal based on certain measured environmental conditions.

Thus it is apparent that embodiments of the present disclosure have provided an effective and efficient method and apparatus for sensing changes to an environment to which the RFID tag is exposed.

Those skilled in the art will recognize that modifications and variations can be made without departing from the spirit of the present disclosure. Therefore, we intend that embodiments of the present disclosure encompass all such variations and modifications as fall within the scope of the appended claims. The system controllers or processors may comprise a microprocessor may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Memory may couple to the microprocessor in the form of a single memory device or a plurality of memory devices. Such a memory device may be a read-only memory, random access memory, volatile memory, non-volatile memory, static memory, dynamic memory, flash memory, cache memory, and/or any device that stores digital information. Note that when the microprocessor implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The memory stores, and the processing module executes, operational instructions corresponding to at least some of the steps and/or functions illustrated in the FIGs.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprises:
    varying, by a tuning module of a passive radio frequency identification (RFID) sensor, a reactive component impedance coupled to the tuning module and an antenna of the passive RFID sensor in order to change a system impedance, wherein the system impedance includes the antenna impedance and the reactive component's impedance, and wherein the antenna impedance is operable to vary within an environment in which the antenna is placed;
    producing, by the tuning module, an impedance value representative of the reactive component's impedance;
    storing, by a memory module of the passive RFID sensor, the impedance value representative of the reactive component's impedance, identification information corresponding to the antenna, and a timestamp corresponding to the impedance value;
    communicating, by a wireless communication module of the passive RFID sensor, the impedance value, the identification information, and the timestamp to an RFID reader, wherein the RFID reader is operable to determine at least one environmental condition from the impedance value; and
    when the impedance value, the identification information, and the timestamp indicate an unfavorable environmental condition:
        generating, by the RFID reader, an alarm signal.

2. The method of claim 1, wherein the reactive component impedance includes one or more of: a variable capacitor, a variable inductor, and a variable resistor.

3. The method of claim 1, wherein the reactive component impedance comprises a varactor driven by an analog signal from the tuning module, the analog signal enabling a continuous reactive component impedance response.

4. The method of claim 1, wherein the antenna impedance changes with one or more of pressure, temperature, humidity, wetness, and proximity.

5. The method of claim 1, wherein the varying the reactive component impedance comprises:
varying, by the tuning module, the reactive component impedance to adjust resonant frequency of the passive RFID sensor to substantially match a carrier frequency of a radio frequency (RF) signal received by the antenna.

6. The method of claim 1, wherein the identification information comprises a unique identification number associated with at least one of: the antenna and the passive RFID sensor.

7. A radio frequency identification (RFID) system comprises:
a passive RFID sensor, wherein the passive RFID sensor comprises:
at least one antenna operable to vary within an environment in which the at least one antenna is placed, wherein each at least one antenna has an antenna impedance; a tuning module coupled to the at least one antenna, wherein the tuning module is operable to:
vary a reactive component impedance coupled to the at least one antenna in order to change a system impedance, wherein the system impedance includes the antenna impedance and the reactive component's impedance; and
produce an impedance value representative of the reactive component's impedance; and
a memory module operable to store the impedance value representative of the reactive component's impedance, identification information corresponding to the at least one antenna, and a timestamp corresponding to the impedance value; and
a wireless communication module operable to communicate the impedance value, the identification information, and the timestamp to an RFID reader; and
the RFID reader, wherein the RFID reader is operable to:
determine at least one environmental condition from the impedance value; and
when the impedance value, the identification information, and the timestamp indicate an unfavorable environmental condition, produce an alarm signal.

8. The RFID system of claim 7, wherein the reactive component impedance includes one or more of: a variable capacitor, a variable inductor, and a variable resistor.

9. The RFID system of claim 7, wherein the reactive component impedance comprises a varactor driven by an analog signal from the tuning module, the analog signal enabling a continuous reactive component impedance response.

10. The RFID system of claim 7, wherein the antenna impedance changes with one or more of pressure, temperature, humidity, wetness, and proximity.

11. The RFID system of claim 7, wherein the tuning module is operable to vary the reactive component impedance by:
varying the reactive component impedance to adjust resonant frequency of the passive RFID sensor to substantially match a carrier frequency a radio frequency (RF) signal received by the at least one antenna.

12. The RFID system of claim 7, wherein the identification information comprises a unique identification number associated with at least one of: the at least one antenna and the passive RFID sensor.

* * * * *